(12) United States Patent
Bornfreund et al.

(10) Patent No.: US 11,916,039 B2
(45) Date of Patent: Feb. 27, 2024

(54) SEMICONDUCTOR DEVICE INTERCONNECTION SYSTEMS AND METHODS

(71) Applicant: Teledyne FLIR Commercial Systems, Inc., Goleta, CA (US)

(72) Inventors: Richard E. Bornfreund, Santa Barbara, CA (US); Edward K. Huang, Newbury Park, CA (US)

(73) Assignee: Teledyne FLIR Commercial Systems, Inc., Goleta, CA (US)

(*) Notice: Subject to any disclaimer, the term of this patent is extended or adjusted under 35 U.S.C. 154(b) by 78 days.

(21) Appl. No.: 17/558,500

(22) Filed: Dec. 21, 2021

(65) Prior Publication Data

US 2022/0115354 A1 Apr. 14, 2022

Related U.S. Application Data

(63) Continuation of application No. PCT/US2020/039443, filed on Jun. 24, 2020.

(Continued)

(51) Int. Cl.
*H01L 23/00* (2006.01)
*H01L 27/146* (2006.01)

(52) U.S. Cl.
CPC ............ *H01L 24/81* (2013.01); *H01L 24/05* (2013.01); *H01L 24/11* (2013.01); *H01L 24/13* (2013.01); *H01L 24/16* (2013.01); *H01L 27/14634* (2013.01); *H01L 27/14636* (2013.01); *H01L 2224/05624* (2013.01);

(Continued)

(58) Field of Classification Search
CPC ......... H01L 24/81; H01L 24/05; H01L 24/11; H01L 24/13; H01L 24/16; H01L 27/14634; H01L 27/14636; H01L 2224/05624; H01L 2224/05644; H01L 2224/05655; H01L 2224/1146; H01L 2224/1147; H01L 2224/13014; H01L 2224/13016
See application file for complete search history.

(56) References Cited

U.S. PATENT DOCUMENTS 5,279,711 A * 1/1994 Frankeny ................ H01L 21/56
228/180.1
2005/0266670 A1* 12/2005 Lin ........................ H01L 24/94
257/E21.705

(Continued)

FOREIGN PATENT DOCUMENTS

WO WO 94/08442 A1 4/1994

*Primary Examiner* — Douglas W Owens
(74) *Attorney, Agent, or Firm* — Haynes and Boone, LLP

(57) ABSTRACT

Techniques are disclosed for facilitating interconnecting semiconductor devices. In one example, a method of interconnecting a first substrate to a second substrate is provided. The method includes forming a first plurality of contacts on the first substrate. The method further includes forming an insulative layer on the first substrate. The method further includes forming a second plurality of contacts on the second substrate. The method further includes joining the first plurality of contacts to the second plurality of contacts to form interconnects between the first substrate and the second substrate. When the first and second substrates are joined, at least a portion of each of the interconnects is surrounded by the insulative layer. Related systems and devices are also provided.

20 Claims, 15 Drawing Sheets

Related U.S. Application Data

(60) Provisional application No. 62/941,577, filed on Nov. 27, 2019, provisional application No. 62/867,183, filed on Jun. 26, 2019.

(52) U.S. Cl.
CPC ............... *H01L 2224/05644* (2013.01); *H01L 2224/05655* (2013.01); *H01L 2224/1146* (2013.01); *H01L 2224/1147* (2013.01); *H01L 2224/13014* (2013.01); *H01L 2224/13016* (2013.01); *H01L 2224/13109* (2013.01); *H01L 2224/16145* (2013.01); *H01L 2224/1703* (2013.01); *H01L 2224/17517* (2013.01); *H01L 2224/81007* (2013.01); *H01L 2224/81139* (2013.01); *H01L 2224/81815* (2013.01)

(56) References Cited

U.S. PATENT DOCUMENTS

2014/0061911 A1    3/2014  Cooper et al.
2018/0082982 A1*   3/2018  Dang ................ H01L 21/02118
2019/0319006 A1*  10/2019  Hung ...................... H01L 24/05

\* cited by examiner

SEMICONDUCTOR DEVICE INTERCONNECTION SYSTEMS AND METHODS

CROSS-REFERENCE TO RELATED APPLICATIONS

This patent application is a continuation of International Patent Application No. PCT/US2020/039443 filed Jun. 24, 2020 and entitled "SEMICONDUCTOR DEVICE INTERCONNECTION SYSTEMS AND METHODS," which claims priority to and the benefit of U.S. Provisional Patent Application No. 62/867,183 filed Jun. 26, 2019, entitled "SEMICONDUCTOR DEVICE INTERCONNECTION SYSTEMS AND METHODS" and U.S. Provisional Patent Application No. 62/941,577 filed Nov. 27, 2019, entitled "SEMICONDUCTOR DEVICE INTERCONNECTION SYSTEMS AND METHODS," all of which are incorporated herein by reference in their entirety.

TECHNICAL FIELD

One or more embodiments relate generally to electrical circuits and semiconductor processing and more particularly, for example, to techniques to interconnect semiconductor devices.

BACKGROUND

For certain types of semiconductor device fabrication, it may be desirable to mate one semiconductor to another. The mated semiconductor devices may be of the same material or different materials, and are mated to physically attach the devices to each other and/or to provide electrical interconnects between the mated semiconductor devices (e.g., to allow electrical conduction of signals between the semiconductor devices).

SUMMARY

In one or more embodiments, a method of interconnecting a first substrate to a second substrate is provided. The method includes forming a first plurality of contacts on the first substrate. The method further includes forming an insulative layer on the first substrate. The method further includes forming a second plurality of contacts on the second substrate. The method further includes joining the first plurality of contacts to the second plurality of contacts to form interconnects between the first substrate and the second substrate. When the first and second substrates are joined, at least a portion of each of the interconnects is surrounded by the insulative layer.

In one or more embodiments, a system includes a first semiconductor device and a second semiconductor device. The first semiconductor device includes a first substrate and an insulative layer. The second semiconductor device includes a second substrate. The system further includes a plurality of interconnects connected to the first semiconductor device and the second semiconductor device, wherein each of the plurality of interconnects is surrounded by a respective portion of the insulative layer.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

Figure 1:
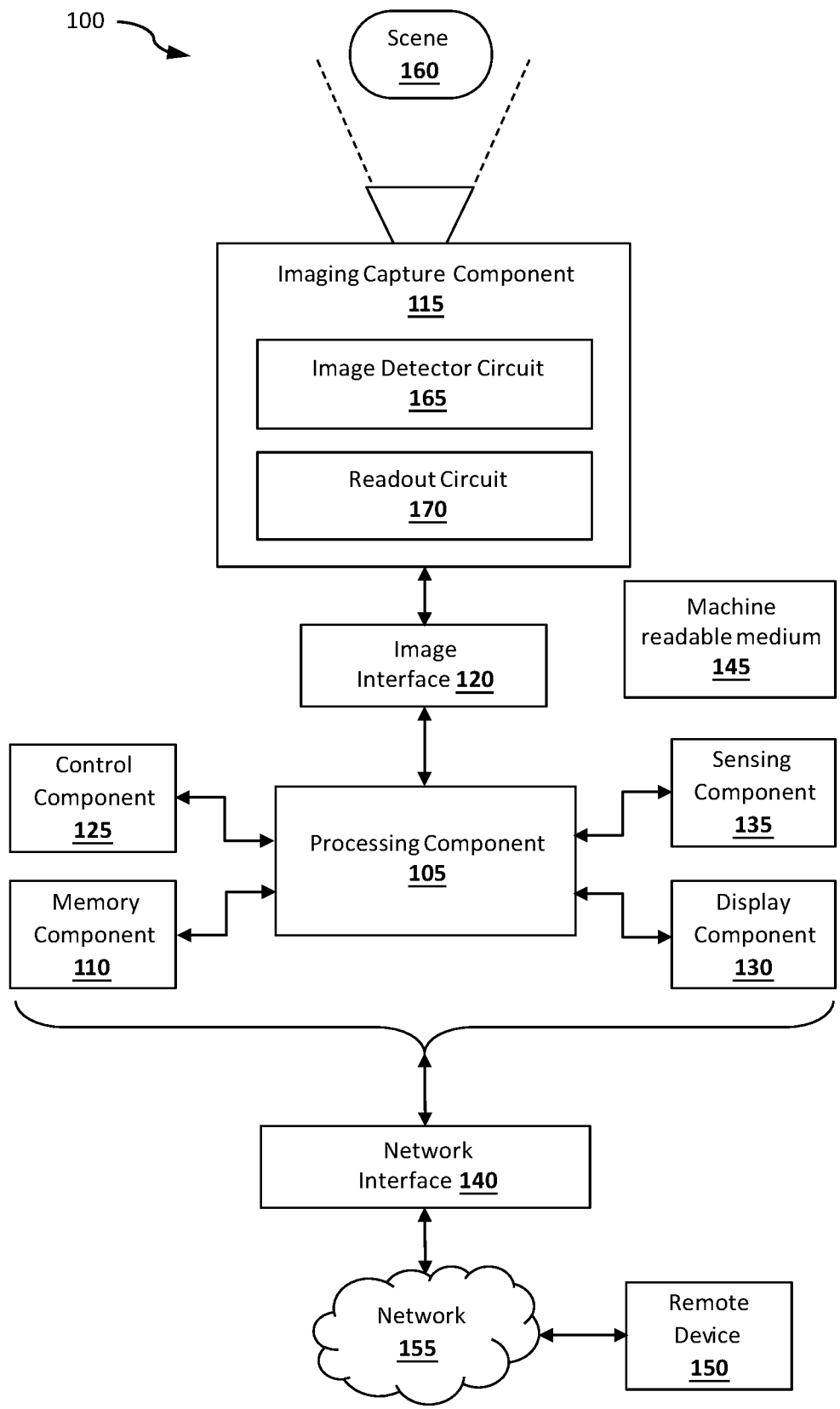
FIG. 1 illustrates a block diagram of an example imaging system in accordance with one or more embodiments of the present disclosure.

Embodiments of the present disclosure and their advantages are best understood by referring to the detailed description that follows. It is noted that sizes of various components and distances between these components are not drawn to scale in the figures. It should be appreciated that like reference numerals are used to identify like elements illustrated in one or more of the figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more embodiments. In one or more instances, structures and components are shown in block diagram form in order to avoid obscuring the concepts of the subject technology. One or more embodiments of the subject disclosure are illustrated by and/or described in connection with one or more figures and are set forth in the claims.

Various embodiments of methods and systems disclosed herein may be used to facilitate interconnecting a first semiconductor device and a second semiconductor device. In an aspect, interconnecting semiconductor devices may be referred to as mating, joining, or contacting the semiconductor devices. The first semiconductor device may include a first substrate and contacts (e.g., a first array of contacts) on the first substrate. The second semiconductor device may include a second substrate and contacts (e.g., a second array of contacts) on the second substrate. The first semiconductor device can be joined to the second semiconductor by joining each of the contacts of the first semiconductor device to a corresponding one of the contacts of the second semiconductor device. Prior to joining the first semiconductor device to the second semiconductor device, each of the first semiconductor device's contacts can be aligned to a corresponding one of the second semiconductor device's contacts to facilitate joining of the first and second semiconductor devices by placing the first semiconductor device's contacts in contact with the second semiconductor device's contacts.

The contacts of the first and second semiconductor devices may have a rectangular prism shape (e.g., a pad having a flat surface or substantially flat surface), a spherical shape, a cone shape, and/or other shape. The contacts of the first semiconductor device and the second semiconductor device may have the same or different physical properties, such as geometric properties (e.g., shape, size) and material properties. In some cases, contacts disposed on the first semiconductor device may have different physical properties from each other, and similarly contacts disposed on the second semiconductor device may have different physical properties from each other. Appropriate alignment of the first and second semiconductor devices can be performed to accommodate different physical properties of the various contacts of the first and second semiconductor devices.

In some embodiments, an insulative layer is disposed on the first semiconductor device or the second semiconductor device. For explanatory purposes, consider that the insulative layer is disposed on the second semiconductor device. Each contact of the second semiconductor device may be surrounded by the insulative layer. In an aspect, each contact may sit in a cavity (e.g., also referred to as a socket, recess, hole, or perforation) defined in the insulative layer. As such, the insulative layer may be referred to as an insulative cavity material or simply a cavity material. By way of non-limiting examples, the insulative layer may be formed from a photoresist material or some other photo-imageable polymer, a dielectric material, or generally any non-electrically conductive material. In one aspect, a material utilized to form the insulative layer may be selected based on its insulative properties and/or its outgassing properties. In various applications, high insulative properties and low outgassing are desired.

In some aspects, channels may be defined in the insulative layer. The channels may be between the cavities. Underfill material may be disposed (e.g., deposited, wicked, flowed) in the channels and, in some cases, partially in the cavities. In one embodiment, the channels may provide wicking epoxy paths to allow traverse/flow of epoxy between the detector circuit and the ROIC. For example, in one case, the channels may extend from one end of the detector circuit to another end of the detector circuit and through the cavities, and the epoxy may be wicked/flowed throughout an underside of the detector circuit. In various embodiments, the underfill material provides mechanical strength to the detector circuit, such as to facilitate thinning processes (e.g., backside substrate processing on the detector circuit after hybridization into an FPA), and thermal cycle reliability by keeping the detector circuit and ROIC aligned. Such thermal cycle reliability may be facilitated for various products, such as cooled products, by keeping the detector circuit and ROIC aligned during cooling. In this regard, by causing the detector circuit and the ROIC to stay aligned during cooling, the detector circuit and the ROIC move together. Ensuring thermal cycle reliability may involve preventing formation of opens or disconnects that may result from differences in thermal expansion coefficients between the detector circuit and the ROIC.

In an aspect, during the joining of the semiconductor devices, the insulative layer mitigates (e.g., avoids, prevents) squeeze-out of the contacts of the semiconductor devices as the semiconductor devices (e.g., the respective contacts thereon) are joined together (e.g., pressed against each other) from shorting interconnections between different portions of one or both of the semiconductor devices. During the joining and subsequent operation of the semiconductor devices, the insulative layer prevents the contacts from slipping and causing shorting interconnections between different portions of one or both of the semiconductor devices. In this regard, each cavity defined in the insulative layer may be utilized to confine interconnects formed by joining the contacts of the semiconductor devices and prevent shorting of these interconnects. In one case, the insulative layer may be utilized as a spacer to facilitate the joining of the semiconductor devices. A height/depth of the cavity can facilitate definition of a uniform hybridization gap and prevent over-squeeze. For example, the insulative layer may be utilized to determine when to stop pressing the semiconductor devices together to prevent one semiconductor device from crushing the other semiconductor device, or vice versa.

In one example, the contacts of the second semiconductor device may be pads having a nominally flat surface (e.g., flat surface or substantially flat surface) and the contacts of the first semiconductor device may be cone-shaped contacts. The contacts of the first semiconductor device may be harder than those of the second semiconductor device such that, when joining the first and second semiconductor devices, the first semiconductor device's contacts penetrate the nominally flat surfaces of the second semiconductor device's contacts with minimal or no slipping. In another example, the contacts of the first and second semiconductor devices may be pads, such that the joining of the semiconductor devices involves joining the pads. In another example, the contacts of the first and second semiconductor devices may be cone-shaped contacts (e.g., spikes) and/or spherical-shaped contacts, such that the joining of the semiconductor devices involves joining these contacts. Appropriate alignment and joining techniques can be performed to accommodate different physical properties (e.g., shape, size, and/or materials) of the various contacts of the first and second semiconductor devices.

In some embodiments, the semiconductor devices are joined to form an imaging system. The first semiconductor device of the imaging system may include a detector circuit having an array of detectors (e.g., also referred to as pixels), with each detector producing a portion of a two-dimensional image. There are a wide variety of image detectors, such as visible-light image detectors, infrared image detectors, or other types of image detectors that may be provided in an image detector array for capturing an image. As an example, a plurality of sensors may be provided in an image detector array to detect electromagnetic (EM) radiation at desired wavelengths. In some cases, such as for infrared imaging, readout of image data captured by the detectors may be performed in a time-multiplexed manner by a readout integrated circuit (ROIC). The image data that is read out may be communicated to other circuitry, such as for processing, storage, and/or display. In some cases, a combination of a detector array and an ROIC may be referred to as a focal plane array (FPA). The detector circuit or the ROIC may include an insulative layer. The insulative layer may prevent the detector circuit and/or ROIC from slipping and causing shorting between pixels (e.g., adjacent pixels), and/or prevent squeeze-out of the contacts to prevent shorting between pixels. Cavities defined in the insulative layer confine interconnects formed by joining the contacts of the detector circuit and RIOC and prevent slip or shorting of the interconnects between pixels.

Although various embodiments of the present disclosure describe joining of a first semiconductor device (e.g., an image detector circuit) and a second semiconductor device (e.g., a readout circuit) to form an imaging system, the first and second semiconductor devices can generally be any two semiconductor devices whose interconnection may be desired (e.g., to allow signal communication between the first and second semiconductor devices). An insulative layer may be disposed on the first semiconductor device or the second semiconductor device to prevent shorting between interconnects of proximate (e.g., adjacent) portions of the semiconductor devices as the interconnects are being formed by joining the contacts of the semiconductor devices as well as after the interconnects have been formed (e.g., after the interconnects have cooled and solidified).

Using various embodiments, techniques are provided to interconnect two semiconductor devices (e.g., hybridization of a detector circuit and a readout circuit). In some aspects, interconnections can be achieved even in semiconductor devices having smaller distances between adjacent interconnects (e.g., referred to as pitches), such as distances of less than 12 μm. The interconnecting may be achieved through control of a volume of contacts (e.g., indium bump volume when the contacts are indium bumps) and contact uniformity. Utilization of an insulative layer on one of the semiconductor devices can prevent post-alignment slip and interconnect shorting. In some cases, a height/depth of each cavity can define a uniform gap between the semiconductor devices (e.g., a uniform hybridization gap) and prevent over-squeeze. Physical properties (e.g., size, shape, and/or material) of the contacts to be joined to form the interconnects can be selected to promote interconnectivity. For instance, the physical properties may be selected to prevent relative slippage (e.g., shifts in an alignment of the detector circuit and the readout circuit) between the semiconductor devices, such as during the process of joining the semiconductor devices (e.g., squeezing the semiconductor devices together to form the interconnects). In this regard, various embodiments facilitate the prevention of shorting out portions of one or both of the semiconductor devices while allowing the joining of the semiconductor devices to attain strong interconnects.

Referring now to the drawings, FIG. 1 illustrates a block diagram of an example imaging system 100 (e.g., an infrared camera) in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided.

The imaging system 100 may be utilized for capturing and processing images in accordance with an embodiment of the disclosure. The imaging system 100 may represent any type of imaging system that detects one or more ranges (e.g., wavebands) of EM radiation and provides representative data (e.g., one or more still image frames or video image frames). The imaging system 100 may include a housing that at least partially encloses components of the imaging system 100, such as to facilitate compactness and protection of the imaging system 100. For example, the solid box labeled 100 in FIG. 1 may represent the housing of the imaging system 100. The housing may contain more, fewer, and/or different components of the imaging system 100 than those depicted within the solid box in FIG. 1. In an embodiment, the imaging system 100 may include a portable device and may be incorporated, for example, into a vehicle or a non-mobile installation requiring images to be stored and/or displayed. The vehicle may be a land-based vehicle (e.g., automobile), a naval-based vehicle, an aerial vehicle (e.g., unmanned aerial vehicle (UAV)), a space vehicle, or generally any type of vehicle that may incorporate (e.g., installed within, mounted thereon, etc.) the imaging system 100. In another example, the imaging system 100 may be coupled to various types of fixed locations (e.g., a home security mount, a campsite or outdoors mount, or other location) via one or more types of mounts.

The imaging system 100 includes, according to one implementation, a processing component 105, a memory component 110, an image capture component 115, an image interface 120, a control component 125, a display component 130, a sensing component 135, and/or a network interface 140. The processing component 105, according to various embodiments, includes one or more of a processor, a microprocessor, a central processing unit (CPU), a graphics processing unit (GPU), a single-core processor, a multi-core processor, a microcontroller, a programmable logic device (PLD) (e.g., field programmable gate array (FPGA)), an application specific integrated circuit (ASIC), a digital signal processing (DSP) device, or other logic device that may be configured, by hardwiring, executing software instructions, or a combination of both, to perform various operations discussed herein for embodiments of the disclosure. The processing component 105 may be configured to interface and communicate with the various other components (e.g., 110, 115, 120, 125, 130, 135, etc.) of the imaging system 100 to perform such operations. For example, the processing component 105 may be configured to process captured image data received from the imaging capture component 115, store the image data in the memory component 110, and/or retrieve stored image data from the memory component 110. In one aspect, the processing component 105 may be configured to perform various system control operations (e.g., to control communications and operations of various components of the imaging system 100) and other image processing operations (e.g., data conversion, video analytics, etc.).

The memory component 110 includes, in one embodiment, one or more memory devices configured to store data and information, including infrared image data and information. The memory component 110 may include one or more various types of memory devices including volatile and non-volatile memory devices, such as random access memory (RAM), dynamic RAM (DRAM), static RAM (SRAM), non-volatile random-access memory (NVRAM), read-only memory (ROM), programmable read-only memory (PROM), erasable programmable read-only memory (EPROM), electrically-erasable programmable read-only memory (EEPROM), flash memory, hard disk drive, and/or other types of memory. As discussed above, the processing component 105 may be configured to execute software instructions stored in the memory component 110 so as to perform method and process steps and/or operations. The processing component 105 and/or the image interface 120 may be configured to store in the memory component 110 images or digital image data captured by the image capture component 115. The processing component 105 may be configured to store processed still and/or video images in the memory component 110.

In some embodiments, a separate machine-readable medium 145 (e.g., a memory, such as a hard drive, a compact disk, a digital video disk, or a flash memory) may store the software instructions and/or configuration data which can be executed or accessed by a computer (e.g., a logic device or processor-based system) to perform various methods and operations, such as methods and operations associated with processing image data. In one aspect, the machine-readable medium 145 may be portable and/or located separate from the imaging system 100, with the stored software instructions and/or data provided to the imaging system 100 by coupling the machine-readable medium 145 to the imaging system 100 and/or by the imaging system 100 downloading (e.g., via a wired link and/or a wireless link) from the machine-readable medium 145. It should be appreciated that various modules may be integrated in software and/or hardware as part of the processing component 105, with code (e.g., software or configuration data) for the modules stored, for example, in the memory component 110.

The imaging system 100 may represent an imaging device, such as a video and/or still camera, to capture and process images and/or videos of a scene 160. In this regard, the image capture component 115 of the imaging system 100 may be configured to capture images (e.g., still and/or video images) of the scene 160 in a particular spectrum or modality. The image capture component 115 includes an image detector circuit 165 (e.g., a thermal infrared detector circuit) and a readout circuit 170 (e.g., an ROIC). For example, the image capture component 115 may include an IR imaging sensor (e.g., IR imaging sensor array) configured to detect IR radiation in the near, middle, and/or far IR spectrum and provide IR images (e.g., IR image data or signal) representative of the IR radiation from the scene 160. For example, the image detector circuit 165 may capture (e.g., detect, sense) IR radiation with wavelengths in the range from around 700 nm to around 2 mm, or portion thereof. For example, in some aspects, the image detector circuit 165 may be sensitive to (e.g., better detect) short-wave IR (SWIR) radiation, mid-wave IR (MWIR) radiation (e.g., EM radiation with wavelength of 2-5 µm) and/or long-wave IR (LWIR) radiation (e.g., EM radiation with wavelength of 7-14 µm), or any desired IR wavelengths (e.g., generally in the 0.7 to 14 µm range). In other aspects, the image detector circuit 165 may capture radiation from one or more other wavebands of the EM spectrum, such as visible-light, ultraviolet light, and so forth.

The image detector circuit 165 may capture image data associated with the scene 160. To capture the image, the image detector circuit 165 may detect image data of the scene 160 (e.g., in the form of EM radiation) and generate pixel values of the image based on the scene 160. An image may be referred to as a frame or an image frame. In some cases, the image detector circuit 165 may include an array of detectors (e.g., also referred to as an array of pixels) that can detect radiation of a certain waveband, convert the detected radiation into electrical signals (e.g., voltages, currents, etc.), and generate the pixel values based on the electrical signals. Each detector in the array may capture a respective portion of the image data and generate a pixel value based on the respective portion captured by the detector. The pixel value generated by the detector may be referred to as an output of the detector. By way of non-limiting example, each detector may be a photodetector, such as an avalanche photodiode, an infrared photodetector, a quantum well infrared photodetector, a microbolometer, or other detector capable of converting EM radiation (e.g., of a certain wavelength) to a pixel value. The array of detectors may be arranged in rows and columns.

The image may be, or may be considered, a data structure that includes pixels and is a representation of the image data associated with the scene 160, with each pixel having a pixel value that represents EM radiation emitted or reflected from a portion of the scene and received by a detector that generates the pixel value. Based on context, a pixel may refer to a detector of the image detector circuit 165 that generates an associated pixel value or a pixel (e.g., pixel location, pixel coordinate) of the image formed from the generated pixel values.

In an aspect, the pixel values generated by the image detector circuit 165 may be represented in terms of digital count values generated based on the electrical signals obtained from converting the detected radiation. For example, in a case that the image detector circuit 165 includes or is otherwise coupled to an analog-to-digital converter (ADC) circuit, the ADC circuit may generate digital count values based on the electrical signals. For an ADC circuit that can represent an electrical signal using 14 bits, the digital count value may range from 0 to 16,383. In such cases, the pixel value of the detector may be the digital count value output from the ADC circuit. In other cases (e.g., in cases without an ADC circuit), the pixel value may be analog in nature with a value that is, or is indicative of, the value of the electrical signal. As an example, for infrared imaging, a larger amount of IR radiation being incident on and detected by the image detector circuit 165 (e.g., an IR image detector circuit) is associated with higher digital count values and higher temperatures.

The readout circuit 170 may be utilized as an interface between the image detector circuit 165 that detects the image data and the processing component 105 that processes the detected image data as read out by the readout circuit 170, with communication of data from the readout circuit 170 to the processing component 105 facilitated by the image interface 120. An image capturing frame rate may refer to the rate (e.g., images per second) at which images are detected in a sequence by the image detector circuit 165 and provided to the processing component 105 by the readout circuit 170. The readout circuit 170 may read out the pixel values generated by the image detector circuit 165 in accordance with an integration time (e.g., also referred to as an integration period).

In various embodiments, a combination of the image detector circuit 165 and the readout circuit 170 may be, may include, or may together provide an FPA. In some aspects, the image detector circuit 165 may be a thermal image detector circuit that includes an array of microbolometers, and the combination of the image detector circuit 165 and the readout circuit 170 may be referred to as a microbolometer FPA. In some cases, the array of microbolometers may be arranged in rows and columns. The microbolometers may detect IR radiation and generate pixel values based on the detected IR radiation. For example, in some cases, the microbolometers may be thermal IR detectors that detect IR radiation in the form of heat energy and generate pixel values based on the amount of heat energy detected. The microbolometer FPA may include IR detecting materials such as amorphous silicon (a-Si), vanadium oxide ($VO_x$), a combination thereof, and/or other detecting material(s). In an aspect, for a microbolometer FPA, the integration time may be, or may be indicative of, a time interval during which the microbolometers are biased. In this case, a longer integration time may be associated with higher gain of the IR signal, but not more IR radiation being collected. The IR radiation may be collected in the form of heat energy by the microbolometers.

In some cases, the imaging capture component 115 may include one or more filters adapted to pass radiation of some wavelengths but substantially block radiation of other wavelengths. For example, the imaging capture component 115 may be an IR imaging device that includes one or more filters adapted to pass IR radiation of some wavelengths while substantially blocking IR radiation of other wavelengths (e.g., MWIR filters, thermal IR filters, and narrow-band filters). In this example, such filters may be utilized to tailor the imaging capture component 115 for increased sensitivity to a desired band of IR wavelengths. In an aspect, an IR imaging device may be referred to as a thermal imaging device when the IR imaging device is tailored for capturing thermal IR images. Other imaging devices, including IR imaging devices tailored for capturing infrared IR images outside the thermal range, may be referred to as non-thermal imaging devices.

In one specific, not-limiting example, the image capture component 115 may comprise an IR imaging sensor having an FPA of detectors responsive to IR radiation including near infrared (NIR), short-wave IR (SWIR), MWIR, long-wave IR (LWIR), and/or very-long wave IR (VLWIR) radiation. In some other embodiments, alternatively or in addition, the image capture component 115 may include a complementary metal oxide semiconductor (CMOS) sensor or a charge-coupled device (CCD) sensor that can be found in any consumer camera (e.g., visible light camera).

Other imaging sensors that may be embodied in the image capture component 115 include a photonic mixer device (PMD) imaging sensor or other time of flight (ToF) imaging sensor, light detection and ranging (LIDAR) imaging device, millimeter imaging device, positron emission tomography (PET) scanner, single photon emission computed tomography (SPECT) scanner, ultrasonic imaging device, or other imaging devices operating in particular modalities and/or spectra. It is noted that for some of these imaging sensors that are configured to capture images in particular modalities and/or spectra (e.g., infrared spectrum, etc.), they are more prone to produce images with low frequency shading, for example, when compared with a typical CMOS-based or CCD-based imaging sensors or other imaging sensors, imaging scanners, or imaging devices of different modalities.

The images, or the digital image data corresponding to the images, provided by the image capture component 115 may be associated with respective image dimensions (also referred to as pixel dimensions). An image dimension, or pixel dimension, generally refers to the number of pixels in an image, which may be expressed, for example, in width multiplied by height for two-dimensional images or otherwise appropriate for relevant dimension or shape of the image. Thus, images having a native resolution may be resized to a smaller size (e.g., having smaller pixel dimensions) in order to, for example, reduce the cost of processing and analyzing the images. Filters (e.g., a non-uniformity estimate) may be generated based on an analysis of the resized images. The filters may then be resized to the native resolution and dimensions of the images, before being applied to the images.

The image interface 120 may include, in some embodiments, appropriate input ports, connectors, switches, and/or circuitry configured to interface with external devices (e.g., a remote device 150 and/or other devices) to receive images (e.g., digital image data) generated by or otherwise stored at the external devices. The received images or image data may be provided to the processing component 105. In this regard, the received images or image data may be converted into signals or data suitable for processing by the processing component 105. For example, in one embodiment, the image interface 120 may be configured to receive analog video data and convert it into suitable digital data to be provided to the processing component 105.

In some embodiments, the image interface 120 may include various standard video ports, which may be connected to a video player, a video camera, or other devices capable of generating standard video signals, and may convert the received video signals into digital video/image data suitable for processing by the processing component 105. In some embodiments, the image interface 120 may also be configured to interface with and receive images (e.g., image data) from the image capture component 115. In other embodiments, the image capture component 115 may interface directly with the processing component 105.

The control component 125 includes, in one embodiment, a user input and/or an interface device, such as a rotatable knob (e.g., potentiometer), push buttons, slide bar, keyboard, and/or other devices, that is adapted to generate a user input control signal. The processing component 105 may be configured to sense control input signals from a user via the control component 125 and respond to any sensed control input signals received therefrom. The processing component 105 may be configured to interpret such a control input signal as a value, as generally understood by one skilled in the art. In one embodiment, the control component 125 may include a control unit (e.g., a wired or wireless handheld control unit) having push buttons adapted to interface with a user and receive user input control values. In one implementation, the push buttons of the control unit may be used to control various functions of the imaging system 100, such as autofocus, menu enable and selection, field of view, brightness, contrast, noise filtering, image enhancement, and/or various other features of an imaging system or camera.

The display component 130 includes, in one embodiment, an image display device (e.g., a liquid crystal display (LCD)) or various other types of generally known video displays or monitors. The processing component 105 may be configured to display image data and information on the display component 130. The processing component 105 may be configured to retrieve image data and information from the memory component 110 and display any retrieved image data and information on the display component 130. The display component 130 may include display circuitry, which may be utilized by the processing component 105 to display image data and information. The display component 130 may be adapted to receive image data and information directly from the image capture component 115, processing component 105, and/or image interface 120, or the image data and information may be transferred from the memory component 110 via the processing component 105.

The sensing component 135 includes, in one embodiment, one or more sensors of various types, depending on the application or implementation requirements, as would be understood by one skilled in the art. Sensors of the sensing component 135 provide data and/or information to at least the processing component 105. In one aspect, the processing component 105 may be configured to communicate with the sensing component 135. In various implementations, the sensing component 135 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder or time-of-flight camera), and/or whether a tunnel or other type of enclosure has been entered or exited. The sensing component 135 may represent conventional sensors as generally known by one skilled in the art for monitoring various conditions (e.g., environmental conditions) that may have an effect (e.g., on the image appearance) on the image data provided by the image capture component 115.

In some implementations, the sensing component 135 (e.g., one or more sensors) may include devices that relay information to the processing component 105 via wired and/or wireless communication. For example, the sensing component 135 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques. In some embodiments, the processing component 105 can use the information (e.g., sensing data) retrieved from the sensing component 135 to modify a configuration of the image capture component 115 (e.g., adjusting a light sensitivity level, adjusting a direction or angle of the image capture component 115, adjusting an aperture, etc.).

In some embodiments, various components of the imaging system 100 may be distributed and in communication with one another over a network 155. In this regard, the imaging system 100 may include a network interface 140 configured to facilitate wired and/or wireless communication among various components of the imaging system 100 over the network 155. In such embodiments, components may also be replicated if desired for particular applications of the imaging system 100. That is, components configured for same or similar operations may be distributed over a network. Further, all or part of any one of the various components may be implemented using appropriate components of the remote device 150 (e.g., a conventional digital video recorder (DVR), a computer configured for image processing, and/or other device) in communication with various components of the imaging system 100 via the network interface 140 over the network 155, if desired. Thus, for example, all or part of the processing component 105, all or part of the memory component 110, and/or all or part of the display component 130 may be implemented or replicated at the remote device 150. In some embodiments, the imaging system 100 may not include imaging sensors (e.g., image capture component 115), but instead receive images or image data from imaging sensors located separately and remotely from the processing component 105 and/or other components of the imaging system 100. It will be appreciated that many other combinations of distributed implementations of the imaging system 100 are possible, without departing from the scope and spirit of the disclosure.

Furthermore, in various embodiments, various components of the imaging system 100 may be combined and/or implemented or not, as desired or depending on the application or requirements. In one example, the processing component 105 may be combined with the memory component 110, image capture component 115, image interface 120, display component 130, sensing component 135, and/or network interface 140. In another example, the processing component 105 may be combined with the image capture component 115, such that certain functions of processing component 105 are performed by circuitry (e.g., a processor, a microprocessor, a logic device, a microcontroller, etc.) within the image capture component 115.

Figure 2:
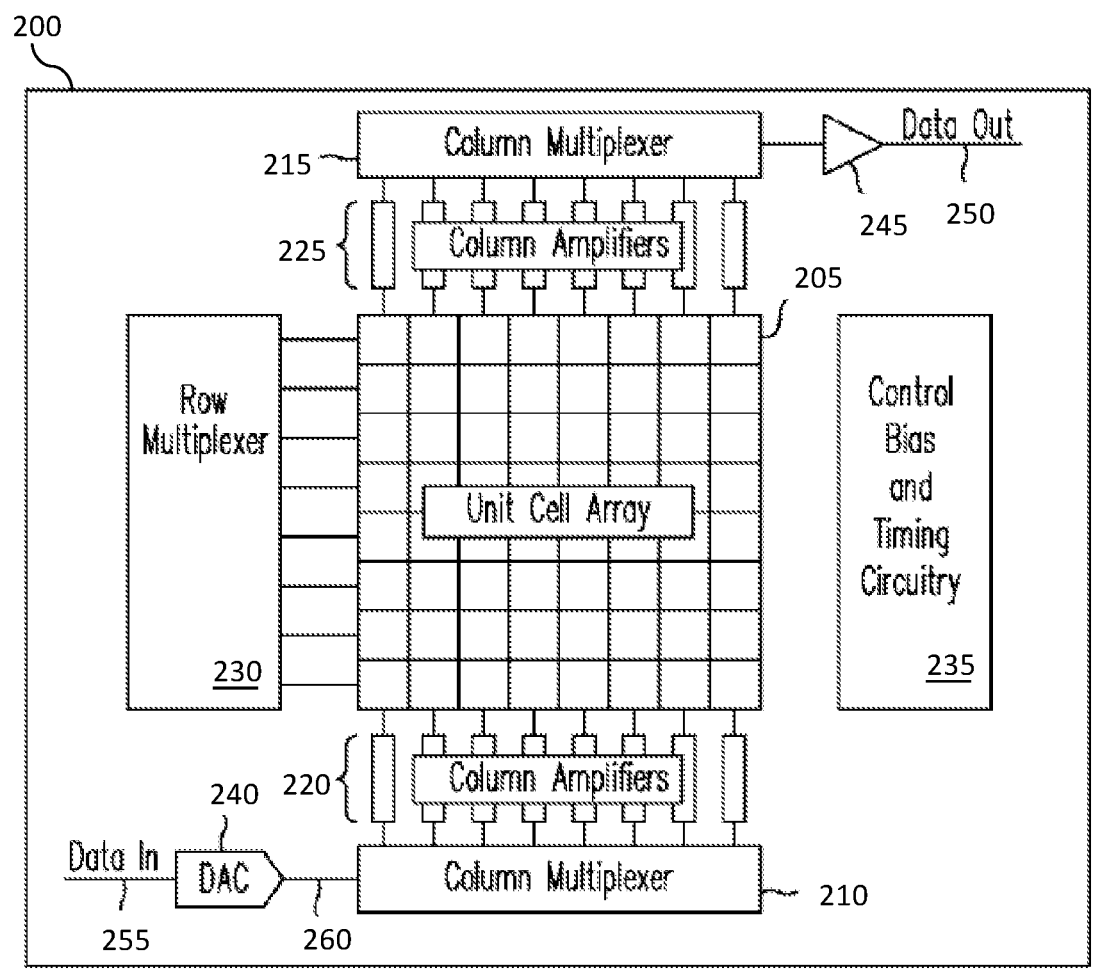
FIG. 2 illustrates a block diagram of an example image sensor assembly in accordance with one or more embodiments of the present disclosure.

FIG. 2 illustrates a block diagram of an example image sensor assembly 200 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the image sensor assembly 200 may be an FPA, for example, implemented as the image capture component 115 of FIG. 1.

The image sensor assembly 200 includes a unit cell array 205, column multiplexers 210 and 215, column amplifiers 220 and 225, a row multiplexer 230, control bias and timing circuitry 235, a digital-to-analog converter (DAC) 240, and a data output buffer 245. The unit cell array 205 includes an array of unit cells. In an aspect, each unit cell may include a detector and interface circuitry. The interface circuitry of each unit cell may provide an output signal, such as an output voltage or an output current, in response to a detector signal (e.g., detector current, detector voltage) provided by the detector of the unit cell. The output signal may be indicative of the magnitude of EM radiation received by the detector. The column multiplexer 215, column amplifiers 220, row multiplexer 230, and data output buffer 245 may be used to provide the output signals from the unit cell array 205 as a data output signal on a data output line 250. The output signals on the data output line 250 may be provided to components downstream of the image sensor assembly 200, such as processing circuitry (e.g., the processing component 105 of FIG. 1), memory (e.g., the memory component 110 of FIG. 1), display device (e.g., the display component 130 of FIG. 1), and/or other component to facilitate processing, storage, and/or display of the output signals. The data output signal may be an image formed of the pixel values for the image sensor assembly 200. In this regard, the column multiplexer 215, the column amplifiers 220, the row multiplexer 230, and the data output buffer 245 may collectively provide an ROIC (or portion thereof) of the image sensor assembly 200. In an embodiment, components of the image sensor assembly 200 may be implemented such that the unit cell array 205 is hybridized to (e.g., bonded to, joined to, mated to) the ROIC.

The column amplifiers 225 may generally represent any column processing circuitry as appropriate for a given application (analog and/or digital), and is not limited to amplifier circuitry for analog signals. In this regard, the column amplifiers 225 may more generally be referred to as column processors in such an aspect. Signals received by the column amplifiers 225, such as analog signals on an analog bus and/or digital signals on a digital bus, may be processed according to the analog or digital nature of the signal. As an example, the column amplifiers 225 may include circuitry for processing digital signals. As another example, the column amplifiers 225 may be a path (e.g., no processing) through which digital signals from the unit cell array 205 traverses to get to the column multiplexer 215. As another example, the column amplifiers 225 may include an ADC for converting analog signals to digital signals (e.g., to obtain digital count values). These digital signals may be provided to the column multiplexer 215.

Each unit cell may receive a bias signal (e.g., bias voltage, bias current) to bias the detector of the unit cell to compensate for different response characteristics of the unit cell attributable to, for example, variations in temperature, manufacturing variances, and/or other factors. For example, the control bias and timing circuitry 235 may generate the bias signals and provide them to the unit cells. By providing appropriate bias signals to each unit cell, the unit cell array 205 may be effectively calibrated to provide accurate image data in response to light (e.g., IR light) incident on the detectors of the unit cells.

In an aspect, the control bias and timing circuitry 235 may generate bias values, timing control voltages, and switch control voltages. In some cases, the DAC 240 may convert the bias values received as, or as part of, data input signal on a data input signal line 255 into bias signals (e.g., analog signals on analog signal line(s) 260) that may be provided to individual unit cells through the operation of the column multiplexer 210, column amplifiers 220, and row multiplexer 230. In another aspect, the control bias and timing circuitry 235 may generate the bias signals (e.g., analog signals) and provide the bias signals to the unit cells without utilizing the DAC 240. In this regard, some implementations do not include the DAC 240, data input signal line 255, and/or analog signal line(s) 260. In an embodiment, the control bias and timing circuitry 235 may be, may include, may be a part of, or may otherwise be coupled to the processing component 105 and/or imaging capture component 115 of FIG. 1.

In an embodiment, the image sensor assembly 200 may be implemented as part of an imaging system (e.g., 100). In addition to the various components of the image sensor assembly 200, the imaging system may also include one or more processors, memories, logic, displays, interfaces, optics (e.g., lenses, mirrors, beamsplitters), and/or other components as may be appropriate in various implementations. In an aspect, the data output signal on the data output line 250 may be provided to the processors (not shown) for further processing. For example, the data output signal may be an image formed of the pixel values from the unit cells of the image sensor assembly 200. The processors may perform operations such as non-uniformity correction (NUC), spatial and/or temporal filtering, and/or other operations. The images (e.g., processed images) may be stored in memory (e.g., external to or local to the imaging system) and/or displayed on a display device (e.g., external to and/or integrated with the imaging system).

By way of non-limiting examples, the unit cell array 205 may include 512×512 (e.g., 512 rows and 512 columns of unit cells), 1024×1024, 2048×2048, 4096×4096, 8192×8192, and/or other array sizes. In some cases, the array size may have a row size (e.g., number of detectors in a row) different from a column size (e.g., number of detectors in a column). Examples of frame rates may include 30 Hz, 60 Hz, and 120 Hz. In an aspect, each unit cell of the unit cell array 205 may represent a pixel.

Figure 3:
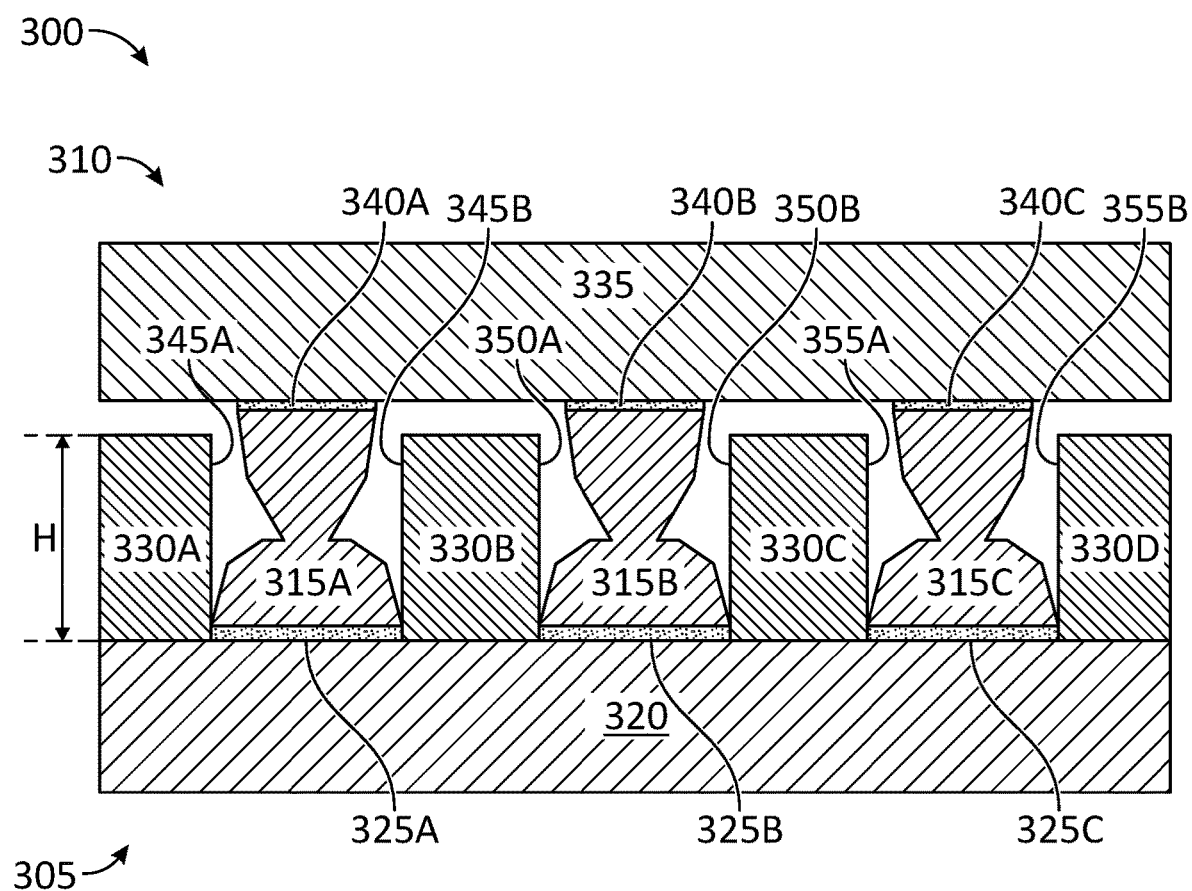
FIG. 3 illustrates a cross-sectional side-view of an example system including two joined semiconductor devices in accordance with one or more embodiments of the present disclosure.

FIG. 3 illustrates a cross-sectional side-view of an example system 300 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the system 300 may be, may include, or may be a part of, the image sensor assembly 200.

The system 300 includes a semiconductor device 305, a semiconductor device 310, and interconnects 315A-C to bond/couple (e.g., mechanically and electrically bond/couple) the semiconductor device 305 to the semiconductor device 310. The semiconductor device 305 includes a substrate 320, pads 325A-C on the substrate 320 (e.g., a surface of the substrate 320), and portions 330A-D of an insulative layer on the substrate 320. The semiconductor device 305 includes a substrate 335 and pads 340A-C on the substrate 335 (e.g., a surface of the substrate 335). The interconnects 315A-C bond to the pads 325A-C and 340A-C of the semiconductor devices 305 and 310, respectively. In this regard, the interconnect 315A bonds to the pads 325A and 340A, the interconnect 315B bonds to the pads 325B and 340B, and the interconnect 315C bonds to the pads 325C and 340C. Each of the interconnects 315A-C is confined in a respective cavity defined in the insulative layer.

In an aspect, the insulative layer may also have channels defined therein. The channels may extend from and/or between one or more cavities. As shown in FIG. 3, the cavity that confines the interconnect 315A is defined by walls 345A and 345B, the cavity that confines the interconnect 315B is defined by walls 350A and 350B, and the cavity that confines the interconnect 315C is defined by walls 355A and 355B. In this regard, the walls 345A and 345B face the interconnect 315A, the walls 350A and 350B face the interconnect 315B, and the walls 355A and 355B face the interconnect 315C. The walls 345A, 345B, 350A, 350B, 355A, and 355B may be referred to as interior walls. In one embodiment, an underfill material may be disposed (e.g., deposited, wicked, flowed) between the walls 345A and 345B and the interconnect 315A, between the walls 350A and 350B and the interconnect 315B, and between the walls 355A and 355B and the interconnect 315C. The underfill material may be epoxy that may be wicked/flowed through the channels and the cavities.

In an aspect, the pads 325A-C on the substrate 320 and the pads 340A-C on the substrate 335 may each include a contact pad. The contact pad may be made from aluminum, nickel, gold, and/or other conductive material. In some cases, the pads 325A-C and 340A-C may include one or more additional layers on the contact pad, such as, for example, chromium or titanium adhesion layers, nickel or nitride diffusion barrier layers, oxide layers, and/or other types of layers. An example thickness/height H (e.g., also referred to as a hybridization gap) of the insulative layer is approximately around 3.8 µm and 4.5 µm. Smaller or larger dimensions may be implemented depending on a particular implementation as would be understood by one skilled in the art. It is noted that system 300 of FIG. 3 may represent a portion of a larger system that includes more of the insulative layer (e.g., more than the three cavities), more interconnects than the three interconnects 315A-C, and so forth than that shown in FIG. 3.

The interconnects 315A-C may include conductive contacts and/or other layers (e.g., of the semiconductor device 305) on the pads 325A-C, conductive contacts and/or other layers (e.g., of the semiconductor device 310) on the pads 340A-C, and/or metallic bonds between the conductive contacts and/or other layers. For example, the interconnect 315A, 315B, and 315C may each represent two separate indium bumps that are interconnected after alignment and hybridization. It is noted that in some embodiments one or more of the interconnects 315A-C may be directly in contact with the substrates 320 and/or 335 (e.g., without the pads 325A-C and/or 340A-C). In some cases, interconnects formed directly onto the substrates 320 and/or 335 may be utilized to provide mechanical support (without necessarily forming an electrical path) between the substrates 320 and 335.

Each of the semiconductor device 305 and the semiconductor device 310 may be, by way of non-limiting examples, a semiconductor chip (e.g., an ROIC made from silicon or germanium), a circuit board (e.g., made from ceramics or metalized ceramics), or a detector circuit (e.g., an IR detector made from InSb, HgCdTe, CdTe, InGaAs, ceramics, or glasses). The substrates 320 and 335 may each include one or more processed semiconductor layers. The processed semiconductor layer(s) may be fabricated using CMOS technology (e.g., silicon CMOS technology) to provide one or more layers that may include, by way of non-limiting examples, one or more circuit elements, one or more metal layers, and/or one or more interconnect layers.

In one embodiment, the semiconductor device 305 may be a detector circuit and the semiconductor device 310 may be a readout circuit (or vice versa). In this aspect, with the semiconductor device 305 representing a detector circuit, the substrate 320 may include one or more processed semiconductor layers to provide an array of sensor devices (e.g., microbolometers). For instance, the substrate 320 may be made from InSb or InGaAs material and may be conductive at room temperature. The semiconductor device 305 may include detectors (e.g., the unit cell array 205). The interconnects 315 bond the detectors of the semiconductor device 305 and the readout circuit of the semiconductor device 310. In one case, each detector may be connected to the readout circuit of the semiconductor device 310 using an interconnect between the semiconductor devices 305 and 310 (e.g., one of the interconnects 315A-C or other interconnects). The interconnects 315A-C may include conductive contacts of the detectors of the semiconductor device 305, conductive contacts of the readout circuit of the semiconductor device 310, and/or metallic bonds between the conductive contacts of the detectors and the conductive contacts of the semiconductor device 310. In one embodiment, the semiconductor device 305 may be bump-bonded to the semiconductor device 310 using bonding bumps. The bonding bumps may be formed on the semiconductor device 305 and/or the semiconductor device 310 to allow connection between the semiconductor device 305 and the semiconductor device 310.

In an aspect, hybridizing the semiconductor device 305 to the semiconductor device 310 may refer to bonding the semiconductor device 305 (e.g., the detectors of the semiconductor device 305) to the semiconductor device 310 to mechanically and electrically bond the semiconductor device 305 and the semiconductor device 310. In some cases, in addition to interconnects utilized to electrically couple the semiconductor device 305 to the semiconductor device 310, additional bumps and/or other structures may be provided on the semiconductor device 305 and/or the semiconductor device 310 to provide physical support (e.g., without providing an electrical connection).

Utilization of the insulative layer on the substrate 320 can prevent post-alignment slip and interconnect shorting. In some cases, a height/depth of each cavity can define a uniform gap between the semiconductor devices (e.g., a uniform hybridization gap) and prevent over-squeeze. In some cases, to avoid sealing the semiconductor devices 305 and 310, a clearance may be provided between the semiconductor devices 305 and 310 by not having the height of each cavity extend so far that a top surface of the portions 330A-D contacts the substrate 335. Physical properties (e.g., size, shape, and/or material) of contacts to be joined to form the interconnects 315A-C between the substrates 320 and 335 can be selected to promote interconnectivity. For instance, the physical properties may be selected to prevent relative slippage (e.g., shifts in an alignment of the detector circuit and the readout circuit) between the substrates 320 and 335, such as during the process of joining the substrates 320 and 335 (e.g., squeezing the substrates 320 and 335 together to form the interconnects 315A-C).

Figure 4:
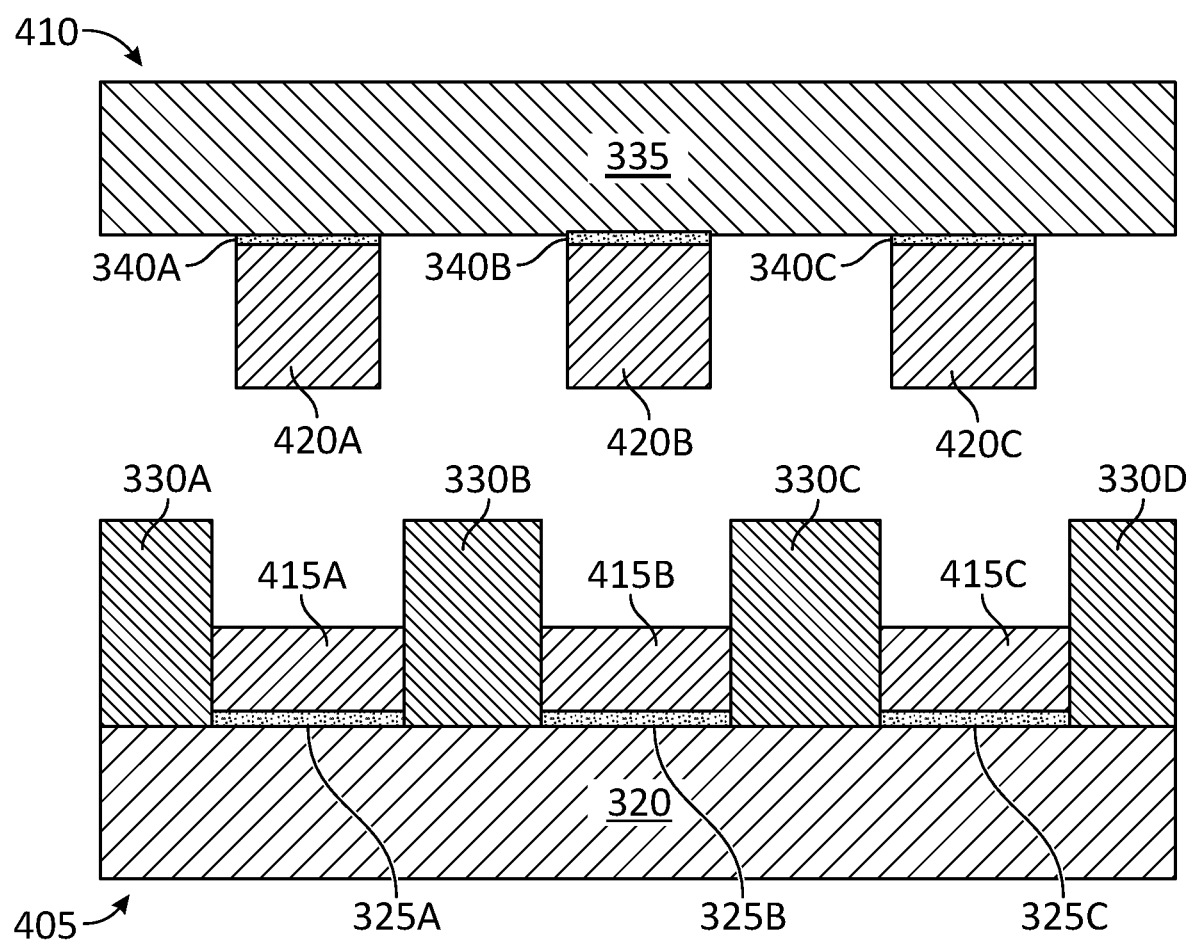
FIGS. 4 and 5 are cross-sectional side-views of two semiconductor device aligned with each other in accordance with one or more embodiments of the present disclosure.

FIG. 4 is a cross-sectional side-view of a semiconductor device 405 aligned with a semiconductor device 410 in accordance with one or more embodiments of the present disclosure. In an embodiment, the semiconductor devices 405 and 410 may be, may include, or may be a part of the semiconductor devices 305 and 310, respectively, before the semiconductor devices 305 and 310 are joined together. In this example, each of the contacts 415A-C can be joined with the corresponding one of the contacts 420A-C to form the interconnects 315A-C.

The semiconductor device 405 includes the substrate 320, the pads 325A-C, the portions 330A-D of the insulative layer, and contacts 415A-C on the pads 325A-C. The semiconductor device 410 includes the substrate 335, the pads 340A-C, and contacts 420A-B on the pads 340A-D. The semiconductor devices 405 and 410 are aligned so that each of the contacts 415A-C of the semiconductor device 405 is aligned with a corresponding one of the contacts 420A-C of the semiconductor device 410. In this regard, the contact 415A, 415B, and 415C are aligned with the contact 420A, 420B, and 420C, respectively.

After alignment, each of the contacts 415A-C can be brought into contact with the corresponding one of the contacts 420A-C to form interconnects (e.g., the interconnects 315A-C) that physically (and in some cases electrically) connect/join the semiconductor devices 405 and 410. Interconnecting of the semiconductor devices 405 and 410 provides interconnections between the substrate 320 and 335. The contacts 415A-C and the contacts 420A-C may be pressed against each other. In some aspects, heat and/or pressure may be applied to the contacts 415A-C and/or the contacts 420A-C to form the interconnects. For example, the contacts 415A-C can be placed on the contacts 420A-C and elevated temperatures applied to diffuse and melt each of the contacts 415A-C into the corresponding one of the contacts 420A-C, elevated pressures applied to cause each of the contacts 415A-C to bond to the corresponding one of the contacts 420A-C (e.g., a cold weld process), or a combination of applying elevated temperatures and elevated pressures. When pressed against each other to form the interconnects, the contacts 415A-C and/or the contacts 420A-C may be deformed. For example, the contacts 415A-C and the contacts 420A-C may be pressed together to form the interconnects 315A-C of FIG. 3. In some cases, formation of the interconnects may be considered completely formed once the interconnects have cooled and solidified.

Figure 5:
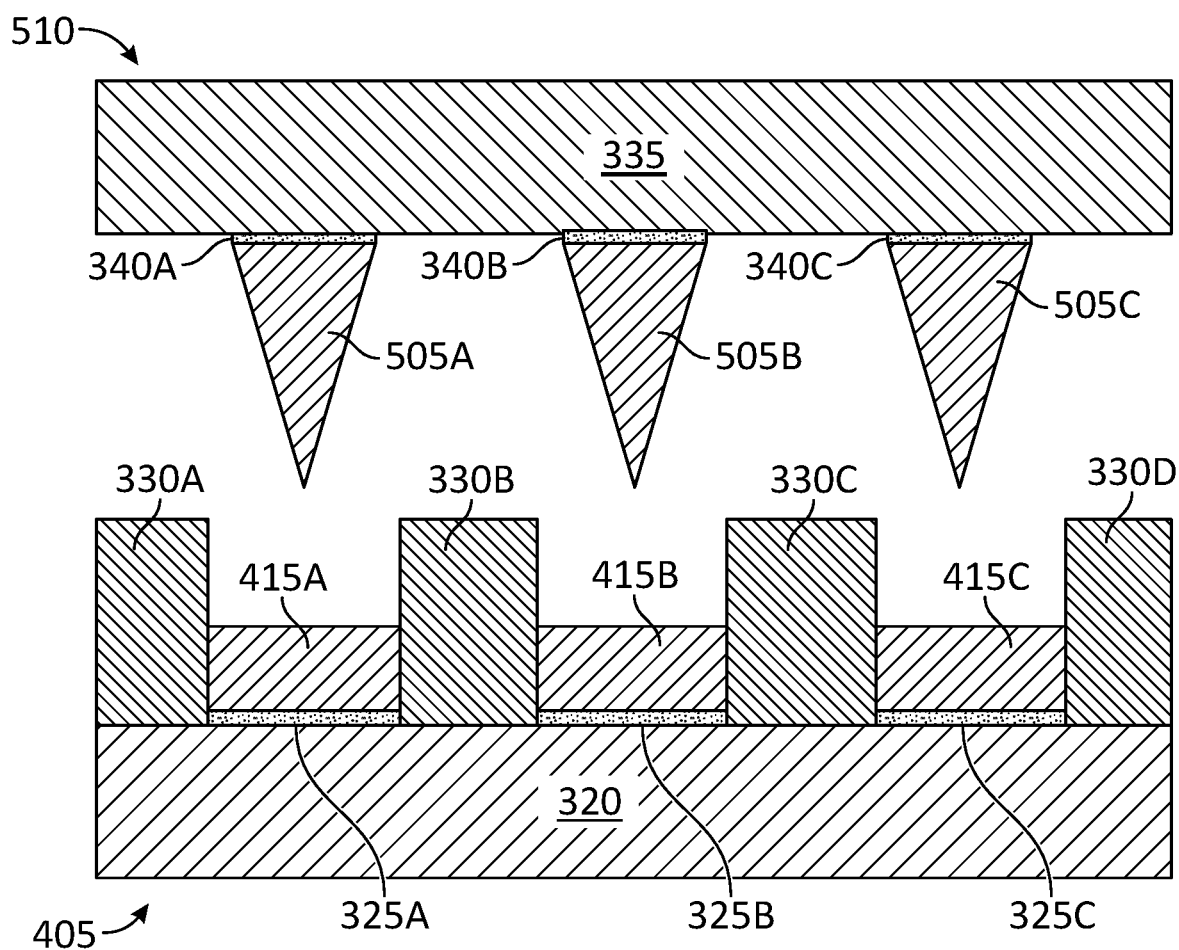

In some aspects, application of heat and/or pressure to the contacts 415A-C and/or the contacts 420A-C may cause heat and/or pressure to be applied to the substrate 320 and/or 335. As an example, the substrates 320 and/or 335 and the contacts 415A-C and/or the contacts 420A-C may be brought to a desired temperature either before or after an alignment procedure to align the semiconductor device 405 and the semiconductor device 410, or after the contacts 415A-C are brought into contact with the contacts 420A-C. The desired contact temperature may be accomplished within a hybridization apparatus using, for example, temperature controlled stages on which the substrates are placed. Once joined, the substrates 320 and 335 and the interconnects may be cooled such that the interconnects solidify. In an aspect, the portions 330A-D of the insulative layer may be utilized as a spacer to facilitate the joining of the semiconductor devices 405 and 410. In this aspect, the insulative material 430A-D may be utilized to determine when to stop pressing the semiconductor device 405 against the semiconductor device 410, and/or vice versa, to prevent the semiconductor device 405 from crushing the semiconductor device 410, or vice versa FIG. 5 is a cross-sectional side-view of the semiconductor device 405 aligned with a semiconductor device 510 in accordance with one or more embodiments of the present disclosure. In an embodiment, the semiconductor devices 405 and 510 may be, may include, or may be a part of the semiconductor devices 305 and 310, respectively, before the semiconductor devices 305 and 310 are joined together. In this example, each of the contacts 415A-C can be joined with the corresponding one of the contacts 505A-C to form the interconnects 315A-C. The description of FIG. 4 generally applies to FIG. 5, with examples of differences and other description provided herein. In some cases, the contacts 505A-C may be harder than the contacts 415A-C such that, when joining the semiconductor devices 405 and 510, the contacts 505A-C penetrate the nominally flat surfaces of the contacts 415A-C with minimal or no slipping.

It is noted that FIGS. 3-5 are provided by way of non-limiting examples. Not all of the depicted components may be required, however, and one or more embodiments may include additional components not shown in the figure. In one example, as a variation of FIG. 5, the insulative layer (e.g., including the portions 330A-D) may be provided on the substrate 335 rather than on the substrate 320. In another example, the contacts 415A-C may be of a different shape (e.g., such as a cone-shape) and the contacts 505A-C may be of a different shape (e.g., such as a pad or a spherical shape) than those shown in FIGS. 3-5. Appropriate alignment and joining of two semiconductor devices (e.g., 305 and 310, 405 and 410, 505 and 510) can be performed to accommodate different physical properties of the various contacts of the semiconductor devices.

Figure 6:
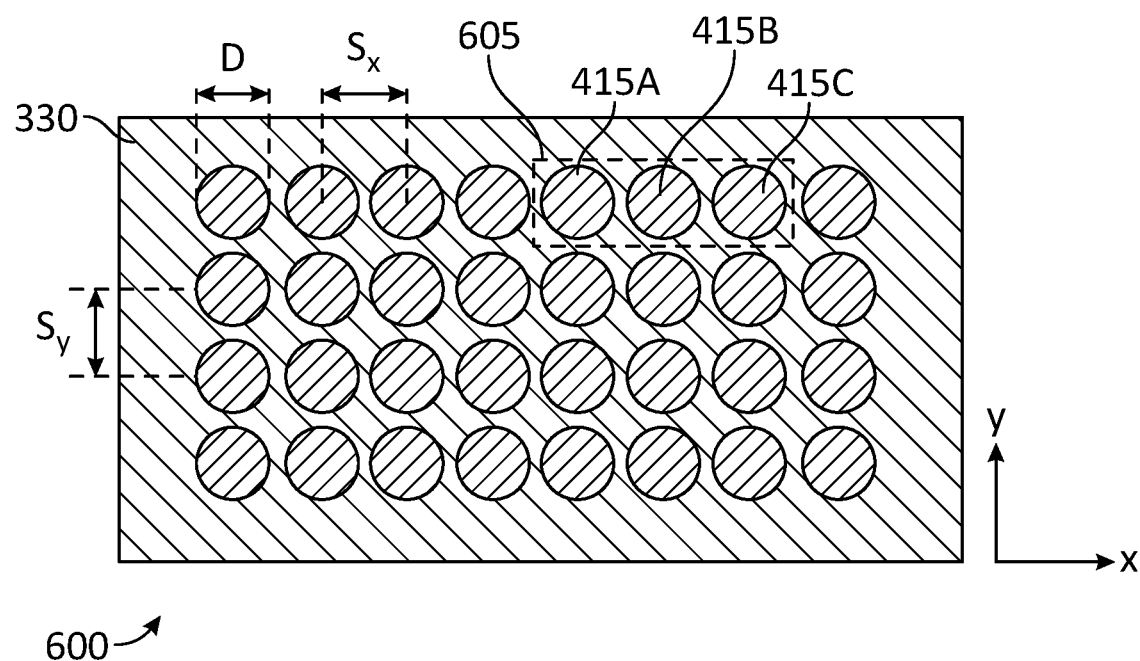
FIG. 6 illustrates a top-down view of a device in accordance with one or more embodiments of the present disclosure.

FIG. 6 illustrates a top-down view of a device 600 that includes the semiconductor device 405 of FIGS. 4 and 5 in accordance with one or more embodiments of the present disclosure. A portion 605 of the device 600 may represent the semiconductor device 405 shown in FIGS. 4 and 5. As shown in FIG. 6, cavities are defined in an insulative layer 330. The portion 605 of the device 600 shows a surface (e.g., top surface) of the portions 330A-D of the insulative layer 330 and a surface (e.g., top surface) of the contacts 415A-C. The device 600 includes an array of contacts (e.g., including the contacts 415A-C), where each of the contacts is in one of the cavities. When the semiconductor device 405 is joined with another semiconductor device (e.g., 410 or 510), each contact of the array of contacts is joined to a corresponding contact on an array of contacts of the other semiconductor device (e.g., the contacts 505A, 505B, and 505C, respectively). A non-limiting example of a size (e.g., a diameter) of each contact is approximately around 4.2 µm and 5.0 µm. A diameter of each cavity may be around the same size or slightly larger than the size of each contact. A spacing $S_x$ and $S_y$ (e.g., referred to as a pitch or a center-to-center distance) denotes a distance along an x-direction and a y-direction, respectively, between adjacent contacts. In FIG. 6, $S_x=S_y$. A non-limiting example of $S_x$ and $S_y$ may be approximately around 5 µm. It is noted that, although the cavities defined in the insulative layer 330 and the contacts are shown as circles, the cavities defined in the insulative layer 330 and/or the contacts may be elliptical, rectangular, triangular, hexagonal, or other shapes. The cavities and the contacts may be, but need not be, of similar shapes and/or similar sizes, so long as each contact can be confined by a corresponding cavity. In some cases, $S_x \neq S_y$. It is further noted that the cavities and the contacts need not be periodically provided in the x- and/or y-directions. Dimensions, shapes, and/or spacing associated with the contacts and the cavities are generally dependent on application (e.g., desired characteristics, manufacturing costs, etc.).

Figure 7:
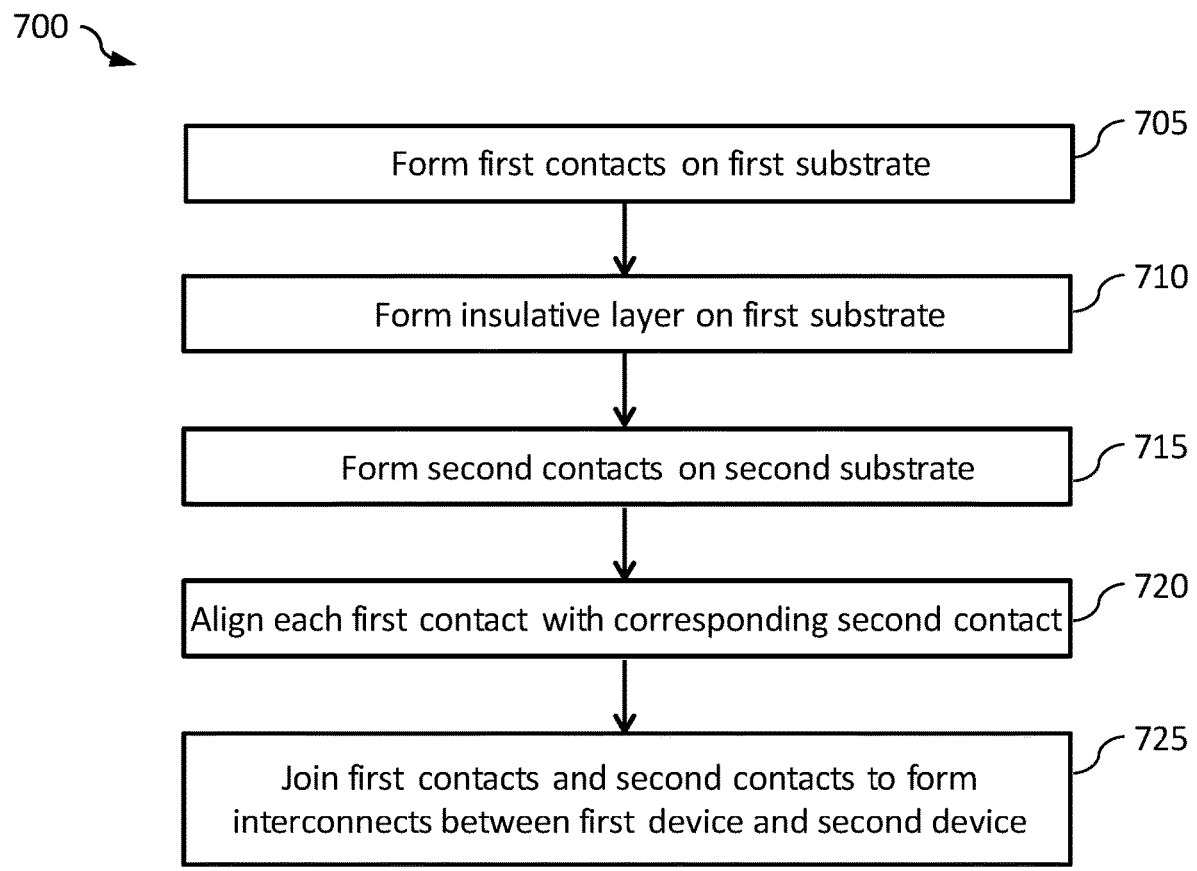
FIG. 7 illustrates a flow diagram of an example process for interconnecting semiconductor devices in accordance with one or more embodiments of the disclosure.

FIG. 7 illustrates a flow diagram of an example process 700 for interconnecting semiconductor devices in accordance with one or more embodiments of the disclosure. For explanatory purposes, the example process 700 is primarily described herein with reference to the structures of FIGS. 3-5. However, the example process 700 is not limited to FIGS. 3-5. Note that one or more operations in FIG. 7 may be combined, omitted, and/or performed in a different order as desired.

At block 705, the contacts 415A-C are formed on the substrate 320. In an aspect, the contacts 415A-C may be formed on the pads 325A-C, as shown in FIG. 5. In another aspect, the contacts 415A-C may be formed directly on the substrate 320. At block 710, the insulative layer 330 is formed on the substrate 320. In an aspect, the insulative layer 330 is an insulative material having cavities defined therein, as shown for example in FIGS. 5 and 6. As shown in FIGS. 5 and 6, each of the contacts 415A-C is within one of the cavities. In this regard, the contact 415A is between the portions 330A-B of the insulative layer 330, the contact 415B is between the portions 330B-C of the insulative layer 330, and the contact 415C is between the portions 330C-D of the insulative layer 330. It is noted that block 705 can be performed prior to block 710 (e.g., the contacts 415A-C are formed on the substrate 320 prior to the insulative layer 330 being formed on the substrate 325) or block 705 can be performed after block 710 (e.g., with appropriate adjustment of patterning of photoresist material). In an aspect, the forming of the insulative layer 330 may optionally include defining channels in the insulative material. Channels may extend from and/or between one or more cavities defined in the insulative material. In some cases, one or more patterning operations of photoresist material may be performed as appropriate to define the cavities and the channels. An example of an insulative layer with cavities and channels defined therein is described below with respect to FIG. 12. At block 715, the contacts 505A-C are formed on the substrate 325. In an aspect, the contacts 505A-C may be formed on the pads 340A-C, as shown in FIG. 5. In another aspect, the contacts 505A-C may be formed directly on the substrate 325.

At block 720, each of the contacts 415A-C is aligned with a corresponding one of the contacts 505A-C. In this regard, the contacts 415A, 415B, and 415C are aligned with the contacts 505A, 505B, and 505C, respectively. At block 725, the contacts 415A-C are joined to the contacts 505A-C to form interconnects between the substrate 320 and the substrate 335, thus joining the semiconductor device 405 to the semiconductor device 510. The contacts 415A-C and the contacts 420A-C may be pressed against each other. In some cases, heat and/or pressure may be applied to the contacts 415A-C and/or the contacts 505A-C to form the interconnects, as provided above with respect to FIG. 5. In an aspect, a hybridization apparatus may be utilized to perform block 720 (e.g., align the contacts 415A-C and 505A-C) and block 725 (e.g., joining the contacts 415A-C and 505A-C).

FIGS. 8A-8E show cross-sectional side-views illustrating an example of processing operations for the semiconductor device 405 to form the contacts 415A-D (e.g., to facilitate joining with the semiconductor device 410) in accordance with one or more embodiments of the present disclosure. In an embodiment, block 705 of FIG. 7 may be implemented by performing one or more of the processing operations shown in FIGS. 8A-8E.

Figure 8A:
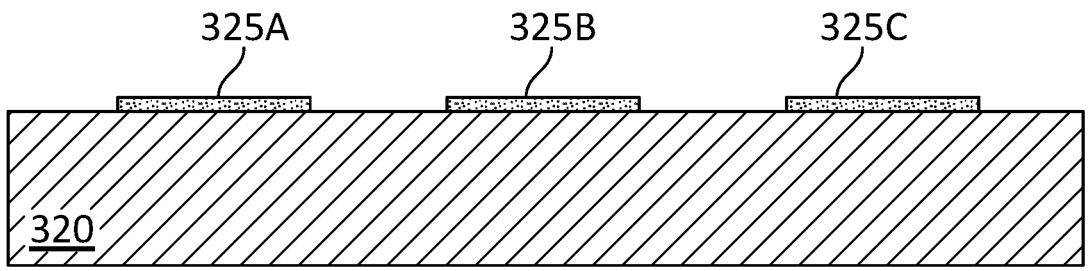
FIGS. 8A-8E show cross-sectional side-views illustrating an example of processing operations for a semiconductor device to form contacts thereon in accordance with one or more embodiments of the present disclosure.

As shown in FIG. 8A, the pads 325A-C are formed on the substrate 320 (e.g., a surface of the substrate 320). The pads 325A-C may be formed using methods known by those of skill in the art. The pads 325A-C on the substrate 320 may each include a contact pad. The contact pad may be made from aluminum, nickel, gold, and/or other conductive material. In some cases, the pads 325A-C may include one or more additional layers on the contact pad, such as, for example, chromium or titanium adhesion layers, nickel or nitride diffusion barrier layers, oxide layers, and/or other types of layers.

Figure 8B:
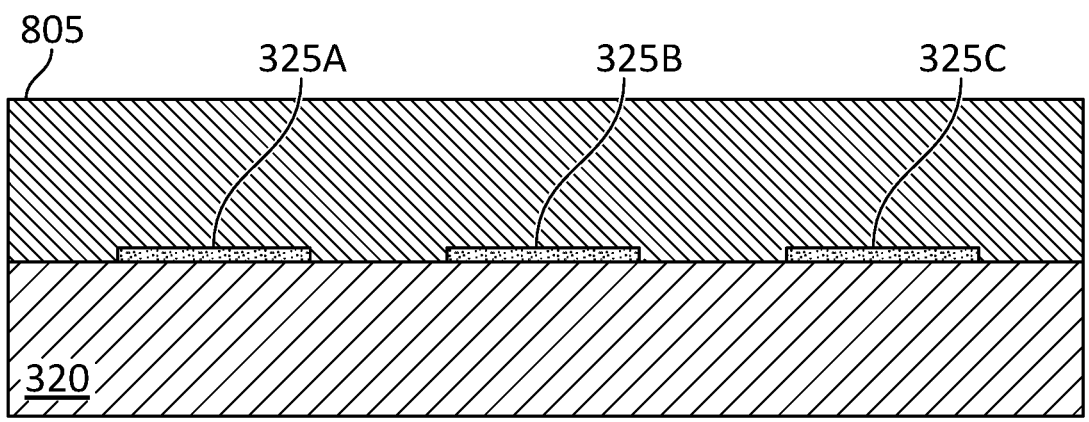
Figure 8C:
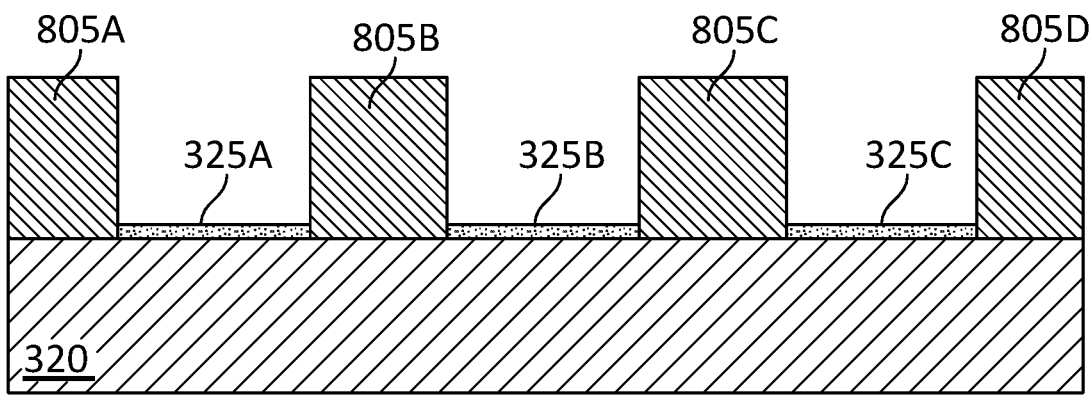

As shown in FIG. 8B, a photoresist layer 805 is formed (e.g., deposited) on the substrate 320. As an example, the photoresist layer 805 may be formed on the substrate 320 by applying photoresist material on the substrate 320 and spinning the substrate 320 to coat (e.g., also referred to as spin-coat) the substrate 320 with the photoresist material in order to form the photoresist layer 805. The photoresist layer 805 is in contact with the substrate 320 and the pads 325A-C. As shown in FIG. 8C, the photoresist layer 805 is patterned (e.g., by performing appropriate lithography followed by etching) such that portions 805A-D of the photoresist layer 805 remain on the substrate 320 whereas the pads 325A-C are exposed (e.g., nominally no photoresist material is on the pads 325A-C). In a case that channels are defined, the photoresist layer 805 may be appropriately patterned to define the channels.

Figure 8D:
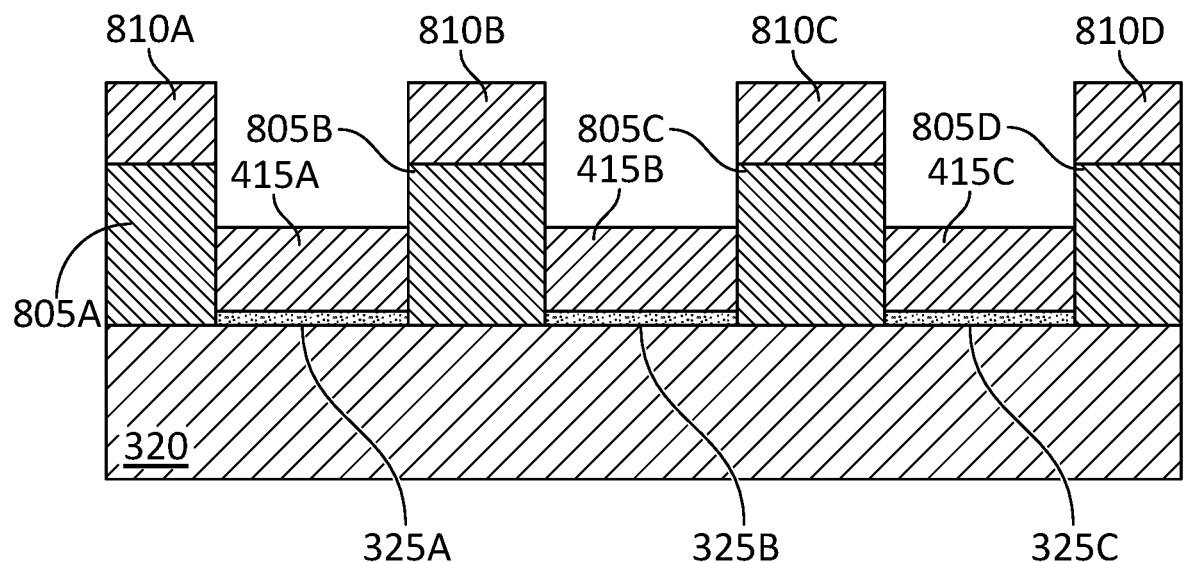
Figure 8E:
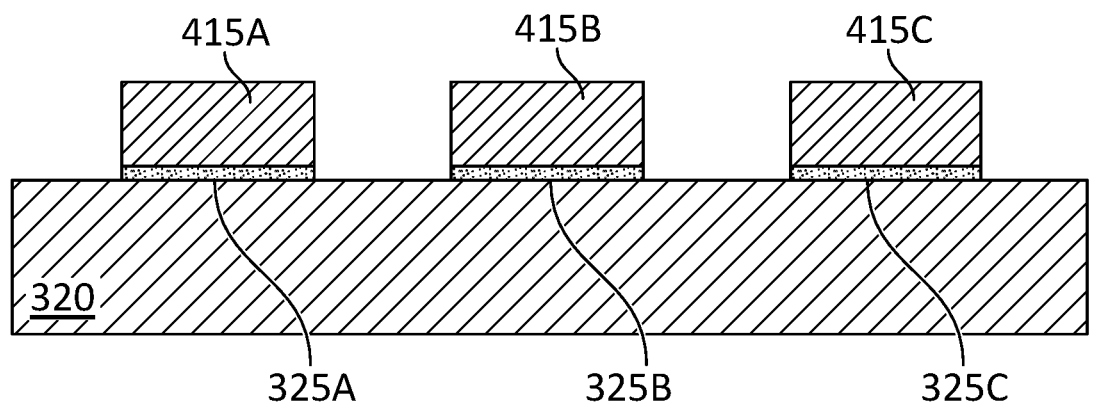

As shown in FIG. 8D, a contact material (e.g., indium) is deposited to form the contacts 415A-C on the pads 325A-C and contact material deposits 810A-D on the portions 805A-D of the photoresist layer 805. The contact material may be deposited using various deposition techniques, such as sputtering, evaporation, electrodeposition, or electroless deposition. In general, the deposition technique utilized to form the bumps depends on the material(s) used to form the bumps. In an aspect, the contact material is deposited such that the contacts 415A-C are of an appropriate shape and size to facilitate subsequent joining of the contacts 415A-C with corresponding contacts of another semiconductor device. For example, in FIG. 8D, the contacts 415A-C provide a flat surface to facilitate joining with corresponding contacts of another semiconductor device. It is noted that although the contacts 415A-C are shown as being rectangular prisms (e.g., pads having nominally flat surfaces), the contacts 415A-C may be spherical (e.g., spherical bumps) or other shapes. As shown in FIG. 8E, the portions 805A-D of the photoresist layer 805 and the contact material deposits 810A-D thereon are removed (e.g., by performing a lift-off process) to leave the pads 325A-C and the contacts 415A-C on the substrate 415. It is noted that in some embodiments one or more of the contacts 415A-C may be formed directly onto the substrate 320 (e.g., without the pads 325A-C). In some cases, such contacts formed directly onto the substrate 320 may be utilized to provide mechanical support (without necessarily forming an electrical path) between two semiconductor devices joined using the contacts.

Figure 9A:
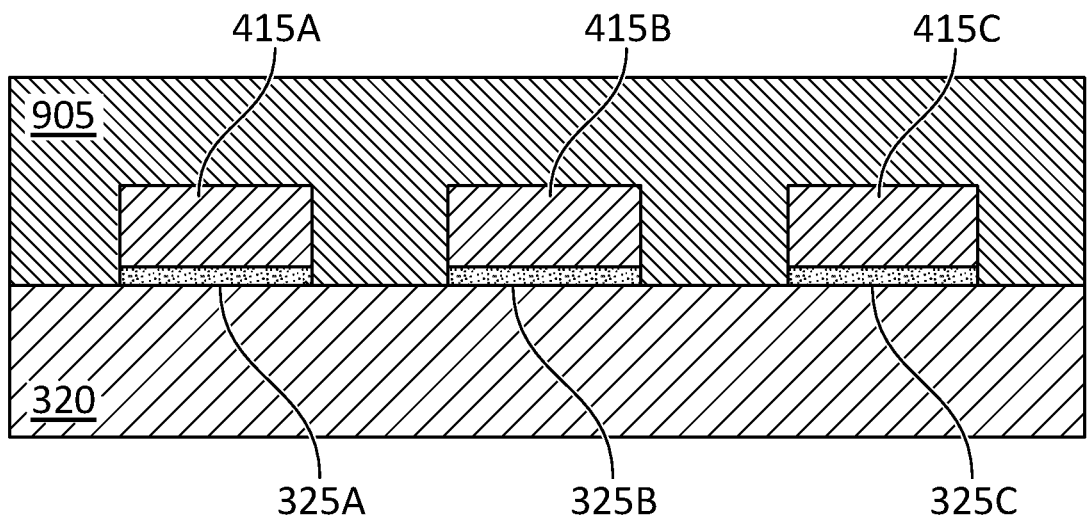
FIGS. 9A and 9B show cross-sectional side-views illustrating an example of processing operations for a semiconductor device to form an insulative layer thereon in accordance with one or more embodiments of the present disclosure.
Figure 9B:
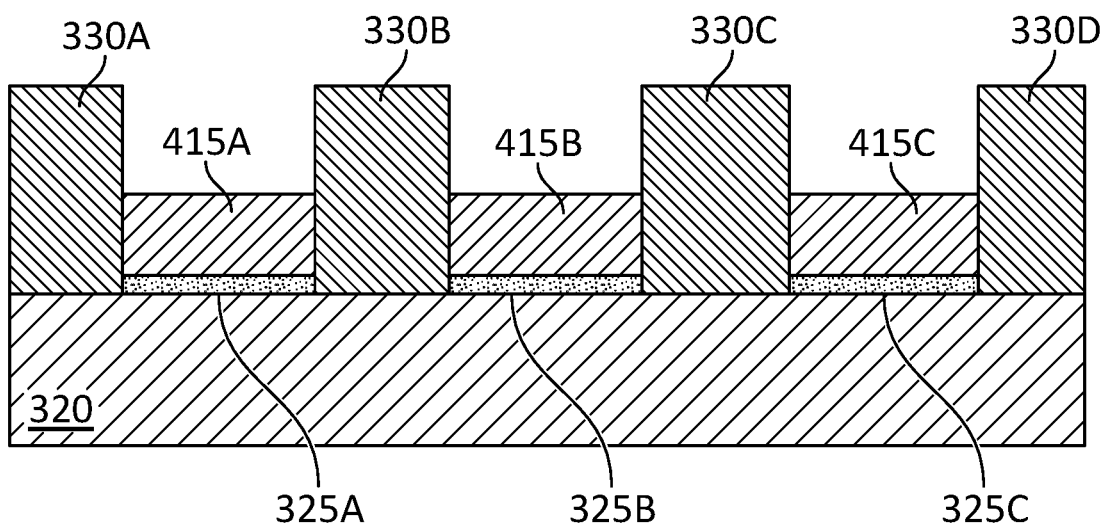

FIGS. 9A and 9B show cross-sectional side-views illustrating an example of processing operations for the semiconductor device 405 of FIG. 4 to form the insulative layer 330 around the contacts 415A-C in accordance with one or more embodiments of the present disclosure. In an embodiment, the processing operations shown in FIGS. 9A and 9B follow the processing operation shown in FIG. 8E. In an embodiment, block 710 of FIG. 7 may be implemented by performing one or more of the processing operations shown in FIGS. 9A and 9B, in which block 710 is performed after block 705. In another embodiment, block 710 can be performed prior to block 705 (e.g., with appropriate adjustments to deposition and patterning of photoresist material) such that the insulative layer 330 is formed on the substrate 320 prior to the contacts 415A-C being formed on the substrate 320.

As shown in FIG. 9A, a photoresist layer 905 is formed (e.g., deposited) on the substrate 320. As an example, the photoresist layer 905 may be spin-coated such that the photoresist layer 905 is on the substrate 320 and the contacts 415A-C. As shown in FIG. 9B, the photoresist layer 905 is patterned (e.g., by performing appropriate lithography followed by etching) such that portions of the photoresist layer 905 remain on the substrate 320, and the contacts 415A-C are exposed (e.g., nominally no photoresist material is on the contacts 415A-C). In the case shown in FIG. 9B, the portions of the photoresist layer 905 that remain on the substrate 320 form the portions 330A-D of the insulative layer 330 of the semiconductor device 405. In this regard, in this example, the insulative layer 330 is a photoresist material. In a case that the insulative layer 330 includes channels defined therein, portions of the photoresist layer 905 may be patterned as appropriate to define the channels. In an embodiment, with the contacts 415A-C exposed, each of the contacts 415A-C may receive a corresponding contact of another semiconductor device (e.g., the semiconductor device 410) to physically (and in some cases electrically) join the semiconductor device 405 to the other semiconductor device.

FIGS. 10A-10E show cross-sectional side-views illustrating another example of processing operations for the semiconductor device 405 of FIG. 4 to form the insulative layer 330 around the contacts 415A-C in accordance with one or more embodiments of the present disclosure. In an embodiment, the processing operations shown in FIGS. 10A-10E follow the processing operation shown in FIG. 8E. In an embodiment, block 710 of FIG. 7 may be implemented by performing one or more of the processing operations shown in FIGS. 10A-10E, in which block 710 is performed after block 705. In another embodiment, block 710 can be performed prior to block 705 such that the insulative layer 330 is formed on the substrate 320 prior to the contacts 415A-C being formed on the substrate 320.

Figure 10A:
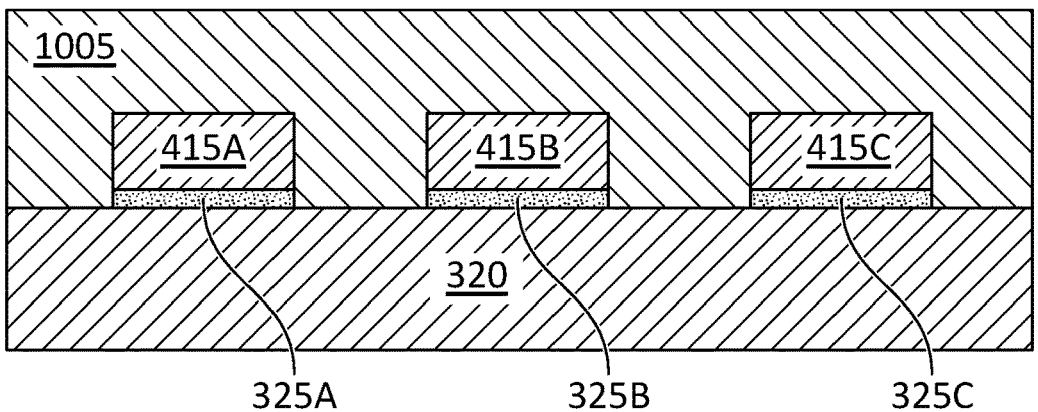
FIGS. 10A-10E show cross-sectional side-views illustrating another example of processing operations for a semiconductor device to form an insulative layer thereon in accordance with one or more embodiments of the present disclosure.
Figure 10B:
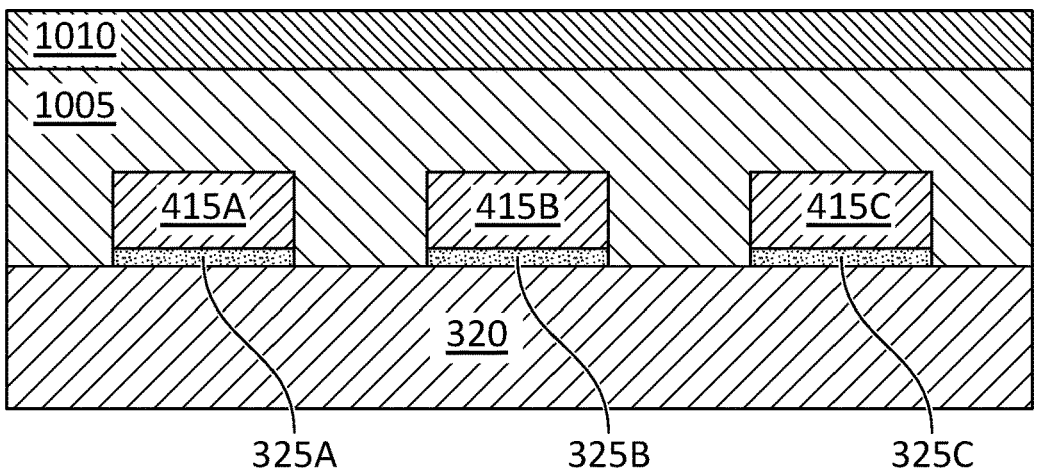
Figure 10C:
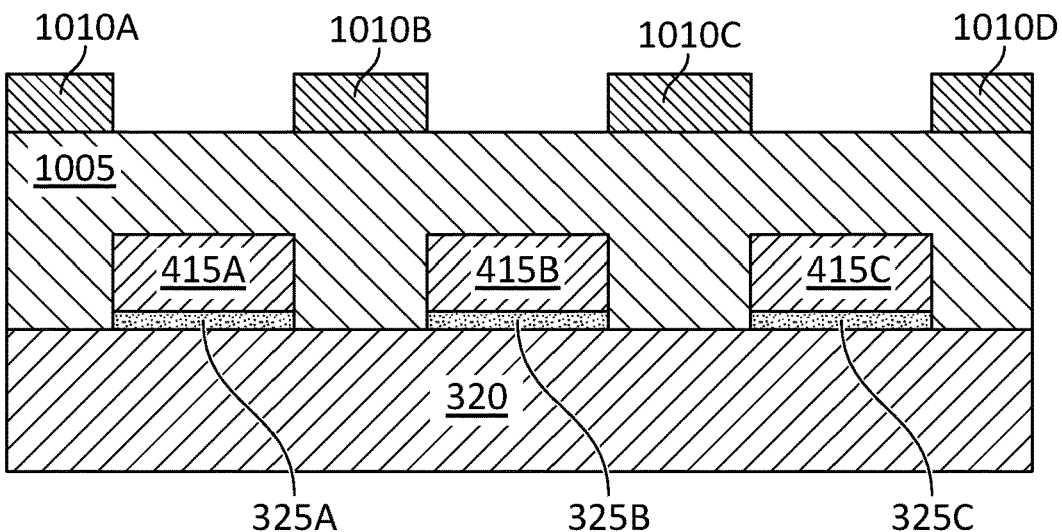
Figure 10D:
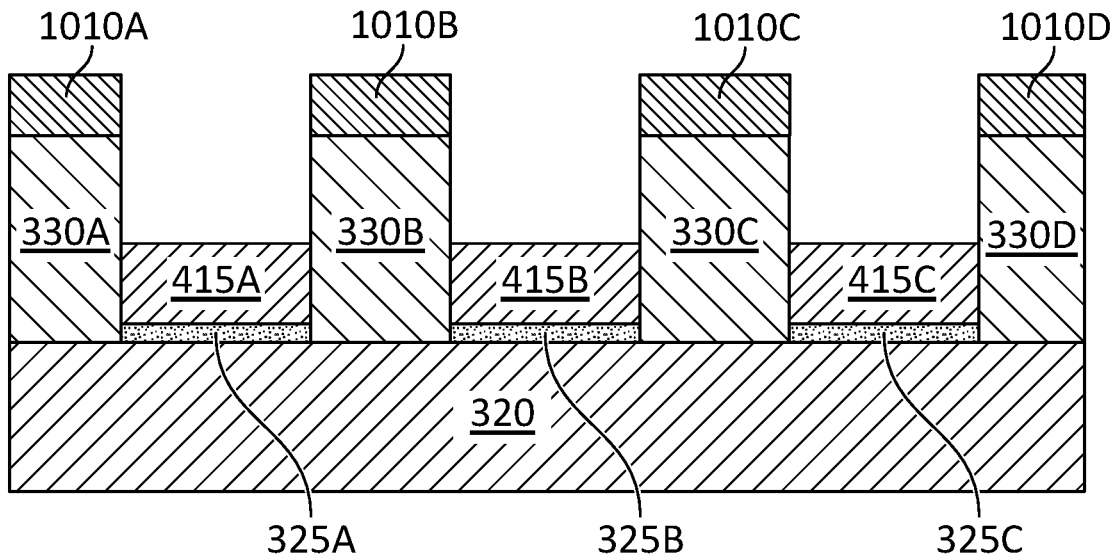
Figure 10E:
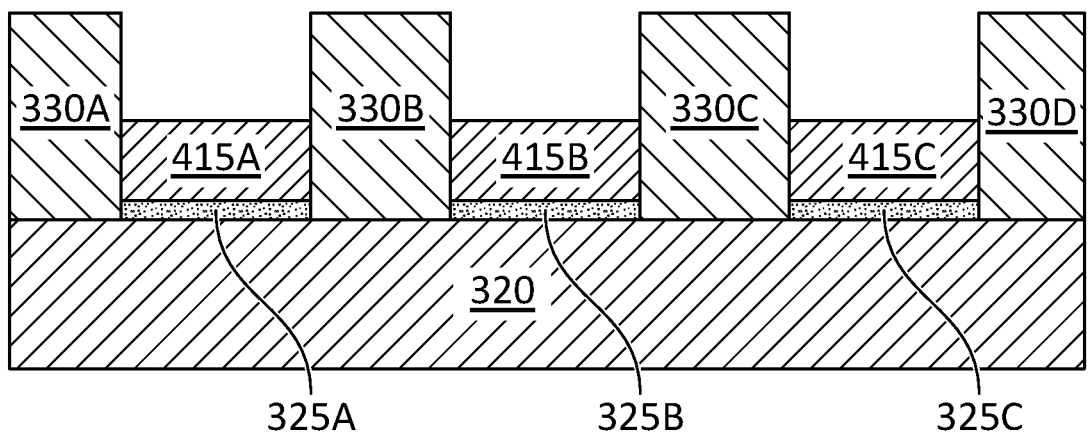

As shown in FIG. 10A, a dielectric layer 1005 is formed (e.g., deposited) on the substrate 320. In one example, the dielectric layer 1005 has a thickness approximately between 2 μm and 4 μm. As shown in FIG. 10B, a photoresist layer 1010 is formed (e.g., spin-coated) on the dielectric layer 1005. As shown in FIG. 10C, the photoresist layer 1010 is patterned (e.g., by performing appropriate lithography followed by etching) such that portions 1010A-D of the photoresist layer 1010 remain on the substrate 320 (e.g., including on the dielectric layer 1005), and the contacts 415A-C are exposed (e.g., nominally no dielectric material is on the contacts 415A-C). As shown in FIG. 10D, the dielectric layer 1005 is etched to remove portions of the dielectric layer 1005 on the contacts 415A-C (e.g., the contacts 415A-C are exposed after etching). As shown in FIG. 10E, the portions 1010A-D of the photoresist layer 1010 are removed. In the case shown in FIGS. 10D and 10E, the portions of the photoresist layer 1010 that remain on the substrate 320 form the portions 330A-D of the insulative layer 330 of the semiconductor device 405. In this regard, in this example, the insulative layer 330 is a dielectric material. In a case that channels are defined, the photoresist layer 1010 may be appropriately patterned to define the channels. In an embodiment, with the contacts 415A-C exposed, each of the contacts 415A-C may receive a corresponding contact of another semiconductor device (e.g., the semiconductor device 410) to join the semiconductor device 405 to the other semiconductor device.

FIGS. 11A-11E show cross-sectional side-views illustrating an example of processing operations for the semiconductor device 410 to form the contacts 505A-D (e.g., to facilitate joining with the semiconductor device 405) in accordance with one or more embodiments of the present disclosure. In an embodiment, block 715 of FIG. 7 may be implemented by performing one or more of the processing operations shown in FIGS. 11A-11E.

Figure 11A:
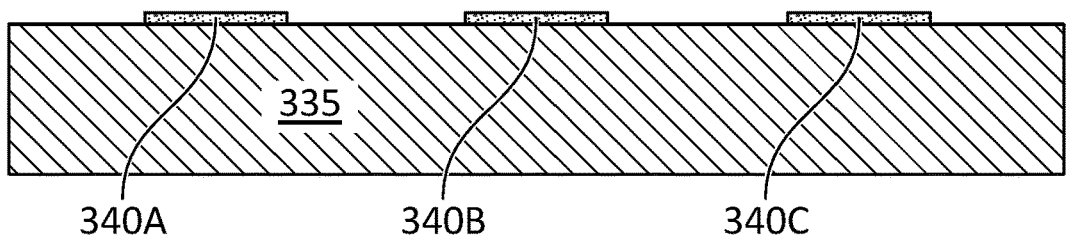
FIGS. 11A-11E show cross-sectional side-views illustrating an example of processing operations for a semiconductor device to form contacts thereon in accordance with one or more embodiments of the present disclosure.
Figure 11B:
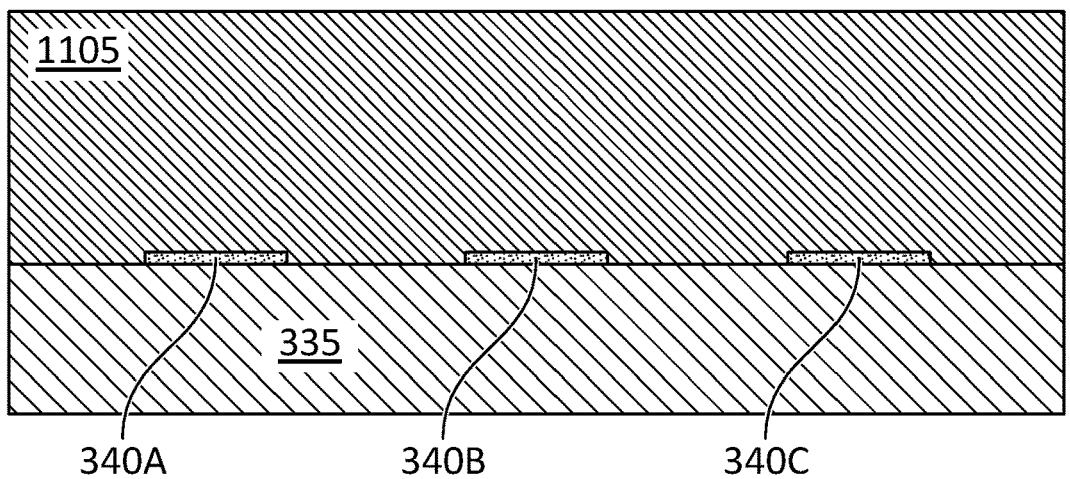

As shown in FIG. 11A, the pads 340A-C are formed on the substrate 325 (e.g., a surface of the substrate 325). The pads 340A-C may be formed using methods known by those of skill in the art. In an aspect, description pertaining to the pads 325A-C (e.g., of FIG. 8A) may apply to the pads 340A-C. As shown in FIG. 11B, a photoresist layer 1105 is formed (e.g., deposited) on the substrate 325. As an example, the photoresist layer 1105 may be formed on the substrate 335 by applying photoresist material on the substrate 335 and spinning the substrate 335 to coat the substrate 335 with the photoresist material in order to form the photoresist layer 1105. The photoresist layer 1105 is in contact with the substrate 325 and the pads 340A-C.

Figure 11C:
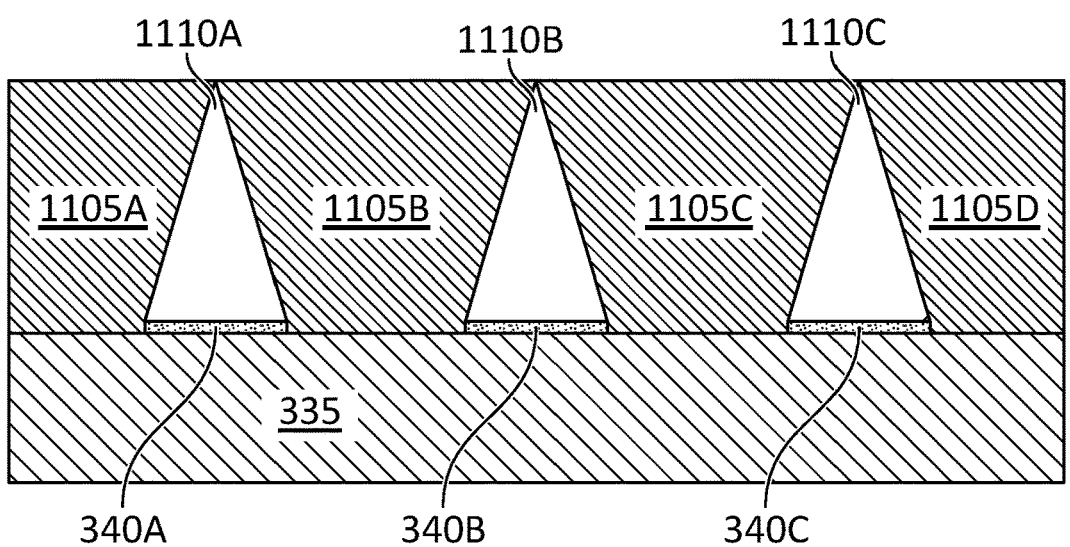
Figure 11D:
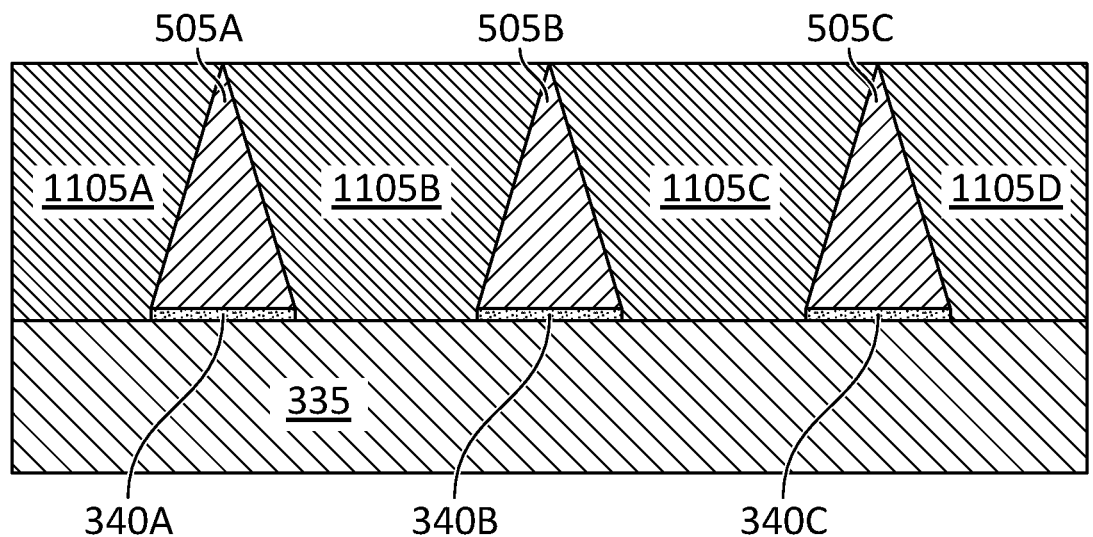
Figure 11E:
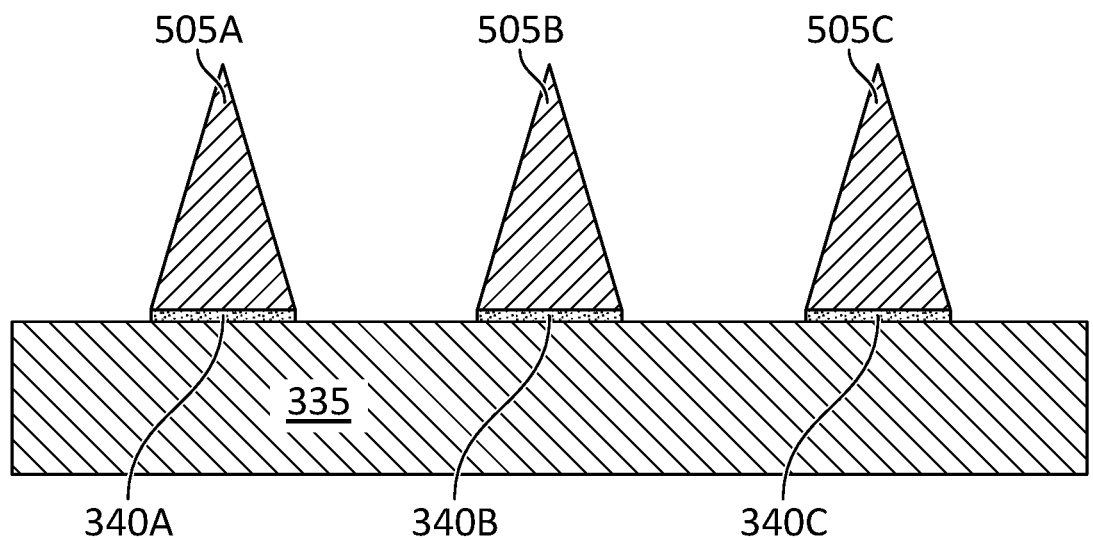

As shown in FIG. 11C, the photoresist layer 1105 is patterned (e.g., by performing appropriate lithography followed by etching) such that portions 1105A-D of the photoresist layer 1105 remain on the substrate 325 and the pads 340A-C are exposed (e.g., nominally no photoresist material is on the pads 340A-C) as shown/denoted by exposed regions 1110A-C. As shown in FIG. 11D, a contact material (e.g., indium) is deposited in the exposed regions 1110A-C to form the contacts 505A-C on the pads 340A-C. In an aspect, the contacts 505A-C are formed by performing a plating process. For example, the plating process may be performed by applying a metal contact (e.g., a spring) to the substrate 335 and providing a current through the metal contact during the plating process to form the contacts 505A-C. As one example, the contacts 505A-C may be approximately around 6 μm and 10 μm in height. As shown in FIG. 11E, the portions 1105A-D of the photoresist layer 1105 are removed. In an embodiment, each of the contacts 505A-C may receive a corresponding contact of another semiconductor device (e.g., the semiconductor device 405) to physically (and in some cases electrically) join the semiconductor device 410 to the other semiconductor device.

In one aspect, the contacts 415A-C (e.g., formed from deposited indium) may be formed to be softer (e.g., softer crystal formations) than the contacts 505A-C (e.g., formed from plated indium to provide harder single or poly crystal formations). In this aspect, with reference to FIGS. 3 and 5, when the semiconductor devices 405 and 410 are joined to each other, the contacts 505A-C tend to join with (e.g., dent) the contacts 415A-C, which are softer and have a flatter, wider surface (e.g., its nominally flat surface) to facilitate receiving of the contacts 505A-C. In some cases, the contacts 505A-C may absorb some thermal expansion coefficient stresses and/or other stresses and strains due, for instance, to material differences between the semiconductor devices 405 and 410.

In one or more embodiments, an insulative layer (e.g., the insulative layer 330) may have cavities defined therein as well as channels defined therein. Underfill material may be disposed (e.g., deposited, wicked, flowed) in the channels and, in some cases, partially in the cavities. In some aspects, the channels may provide wicking epoxy paths to allow traverse/flow of epoxy between the detectors and the ROIC. For example, in one case, the channels may extend from one end of the detector circuit to another end of the detector circuit and through the cavities, and the epoxy may be wicked/flowed throughout an underside of the detector circuit.

In various embodiments, the underfill material provides mechanical strength to the detector circuit, such as to facilitate thinning processes (e.g., backside substrate processing on the detector circuit after hybridization into an FPA), and thermal cycle reliability by keeping the detector circuit and ROIC aligned. Such thermal cycle reliability may be facilitated for various products, such as cooled products, by keeping the detector circuit and ROIC aligned during cooling. In this regard, by causing the detector circuit and the ROIC to stay aligned during cooling, the detector circuit and the ROIC move together. Ensuring thermal cycle reliability may involve preventing formation of opens or disconnects that may result from differences in thermal expansion coefficients between the detector circuit and the ROIC.

Figure 12:
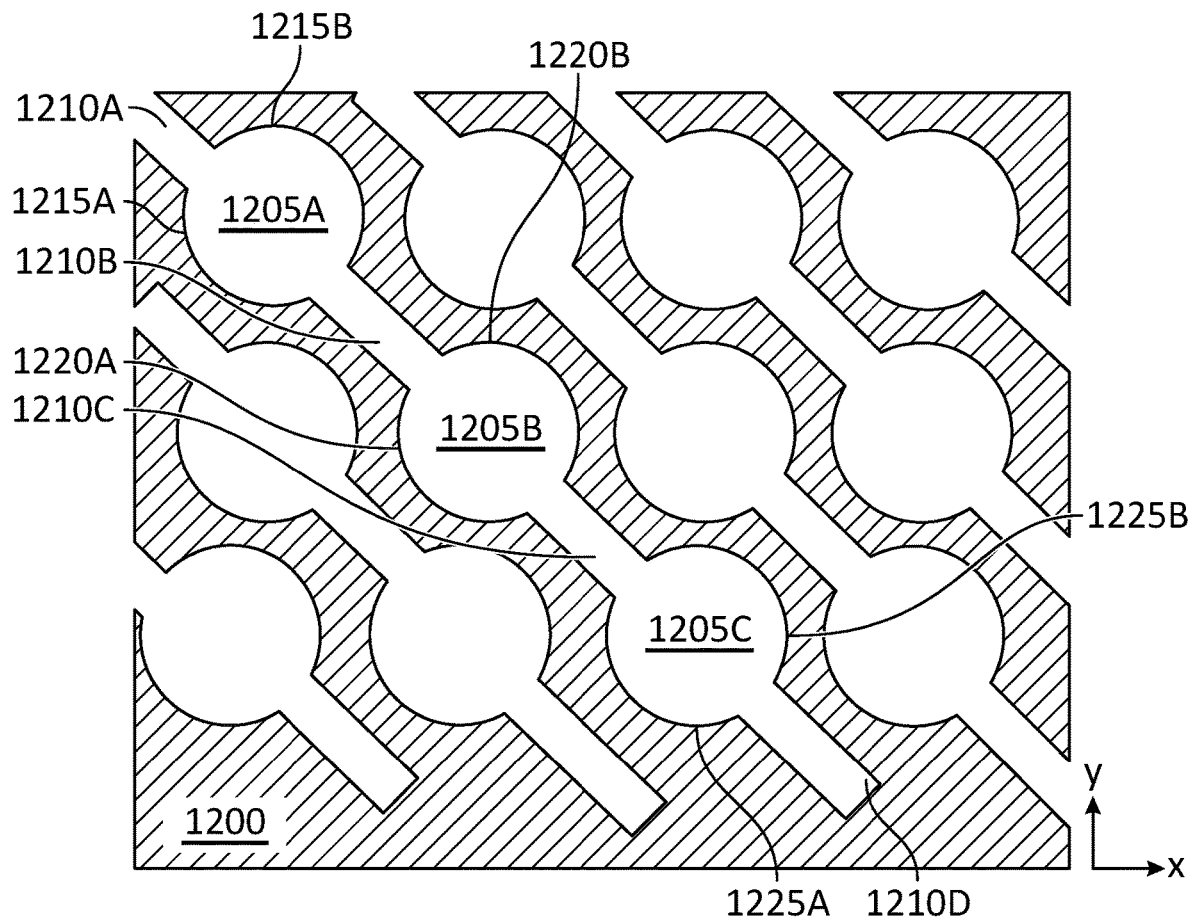
FIG. 12 illustrates a top-down view of an insulative layer in accordance with one or more embodiments of the present disclosure.

As an example, FIG. 12 illustrates a top-down view of an insulative layer 1200 in accordance with one or more embodiments of the present disclosure. The description of FIG. 6 generally applies to FIG. 12, with examples of differences between FIGS. 6 and 12 and other description provided herein. The insulative layer 1200 has cavities defined therein, of which cavities 1205A-C are explicitly labeled. The insulative layer 1200 also has channels defined therein, of which channels 1210A-D are explicitly labeled. In one embodiment, the channels may be formed during block 710 of FIG. 7. For example, as part of forming an insulative layer, one or more patterning operations of photoresist material may be performed to define the cavities and the channels of the resulting insulative layer.

Walls 1215A and 1215B define the cavity 1205A, walls 1220A and 1220B define the cavity 1205B, and walls 1225A and 1225B define the cavity 1205C. The channel 1210A extends from the cavity 1205A. The channel 1210B extends between the cavity 1205A and 1205B. The channel 1210C extends between the cavity 1205B and 1205C. The channel 1210D extends from the cavity 1205C. Although in FIG. 12 the channels extend along a 45° diagonal direction from top-left to bottom-right relative to the depicted xy-axis, alternatively or in addition, channels may be defined along a 45° diagonal direction from bottom-left to top-right (e.g., 90° relative to the channels depicted in FIG. 12). Furthermore, the diagonal direction need not be at 45° angles. Alternatively or in addition to the channels being defined along one or more diagonal directions, channels may be defined along the x-direction and/or the y-direction. It is noted that, although the cavities defined in the insulative layer 1200 and the contacts are shown as circles, the cavities defined in the insulative layer 1200 and/or the contacts may be elliptical, rectangular, triangular, hexagonal, or other shapes. The cavities and the contacts may be, but need not be, of similar shapes and/or similar sizes, so long as each contact can be confined by a corresponding cavity.

In an embodiment, the insulative layer 1200 may be provided on a first semiconductor device. The first semiconductor device may include an array of contacts, where each of the contacts is in one of the cavities defined in the insulative layer 1200. For example, the walls 1215A and 1215B are interior walls that face the contact disposed in the cavity 1205A, the walls 1220A and 1220B are interior walls that face the contact disposed in the cavity 1205B, and so forth. The first semiconductor device may be joined with a second semiconductor device by joining each contact of the array of contacts of the first semiconductor device with a corresponding contact on an array of contacts of the second semiconductor device. Each cavity is defined by insulative walls (e.g., the walls 1215A, 1215B, 1220A, 1220B, 1225A, and 1225B) that confine a contact and helps prevents shorting between contacts of different cavities. Such shorting prevention may protect against shorting that occurs, for example, in the x- and y-directions. In an aspect, the first semiconductor device may include a detector circuit and the second semiconductor device may include a readout circuit.

Underfill material may be disposed in the channels and, in some cases, partially in the cavities. In some aspects, the channels defined in the insulative layer 1200 may provide paths through which epoxy can flow. For example, the epoxy can wick throughout an underside of the detector circuit. Through such wicking, the epoxy may be disposed between the first and second semiconductor devices. For example, with reference to the labeled cavities and channels, the epoxy may be disposed in the channels 1210A-D and between walls (e.g., the walls 1215A and 1215B) of each cavity (e.g., the cavity 1205A) and the contact disposed in the cavity. In various embodiments, the underfill material provides mechanical strength to the detector circuit, such as to facilitate thinning processes, and thermal cycle reliability by keeping the detector circuit and ROIC aligned.

Figure 13:
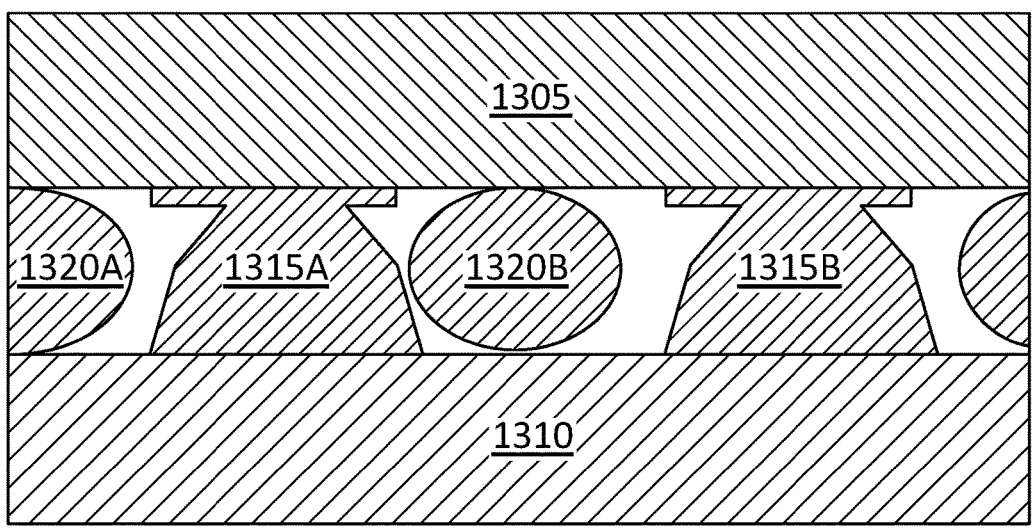
FIG. 13 illustrates a system including two joined semiconductor devices in accordance with one or more embodiments of the present disclosure.

FIG. 13 illustrates a system including two joined semiconductor devices in accordance with one or more embodiments of the present disclosure. The system includes a semiconductor device 1305 (e.g., detector) and a semiconductor device 1310 (e.g., ROIC). The detector may be a visible-SWIR InGaAs detector. The semiconductor devices 1305 and 1310 are interconnected using interconnects 1315A and 1315B. In one example, as shown in FIG. 13, the interconnects 1315A and 1315B are each formed by joining a respective pad on the semiconductor device 1305 with a respective bump disposed on the semiconductor device 1310. An insulative layer, which includes portions 1320A and 1320B, confines the interconnects 1315A and 1315B. In some cases, the insulative layer may have channels defined therein. In such cases, underfill material may be disposed in the channels and, in some cases, partially in the cavities.

It is noted that dimensional aspects provided above are examples and that other values for the dimensions can be utilized in accordance with one or more implementations. Furthermore, the dimensional aspects provided above are generally nominal values. As would be appreciated by a person skilled in the art, each dimensional aspect has a tolerance associated with the dimensional aspect. Similarly, aspects related to distances between features also have associated tolerances.

Terms such as "top", "bottom", "front", "rear", "side", "horizontal", "vertical", and the like refer to an arbitrary frame of reference, rather than to the ordinary gravitational frame of reference. Thus, such a term may extend upwardly, downwardly, diagonally, or horizontally in a gravitational frame of reference.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

The foregoing description is not intended to limit the present disclosure to the precise forms or particular fields of use disclosed. Embodiments described above illustrate but do not limit the invention. It is contemplated that various alternate embodiments and/or modifications to the present invention, whether explicitly described or implied herein, are possible in light of the disclosure. Accordingly, the scope of the invention is defined only by the following claims.

What is claimed is:

1. A method of interconnecting a first substrate to a second substrate, the method comprising:
   forming a first plurality of contacts on the first substrate;
   forming an insulative layer on the first substrate;
   forming a second plurality of contacts on the second substrate;
   aligning the first plurality of contacts with the second plurality of contacts; and
   joining the first plurality of contacts to the second plurality of contacts based on the aligning to form interconnects between the first substrate and the second substrate, wherein, when the first and second substrates are joined, at least a portion of each of the interconnects is surrounded by the insulative layer, wherein the joining comprises pressing each of the second plurality of contacts against a corresponding one of the first plurality of contacts, and wherein the first plurality of contacts is formed on the first substrate after the insulative layer is formed on the first substrate.

2. The method of claim 1, wherein each of the first plurality of contacts provides a substantially flat surface to receive a corresponding one of the second plurality of contacts, and wherein each of the second plurality of contacts is harder than a corresponding one of the first plurality of contacts to penetrate the substantially flat surface of the corresponding one of the first plurality of contacts during the joining.

3. The method of claim 1, wherein the joining comprises:
applying heat and/or pressure to the first plurality of contacts and/or the second plurality of contacts; and
placing the first plurality of contacts in contact with the second plurality of contacts to form the interconnects.

4. The method of claim 1, further comprising forming a first plurality of pads on the first substrate, wherein each of the first plurality of contacts is on a corresponding one of the first plurality of pads, wherein the insulative layer is a dielectric layer or a photoresist layer, wherein the second plurality of contacts is harder than the first plurality of contacts, wherein the first substrate is part of a detector circuit, and wherein the second substrate is part of a readout circuit.

5. A system formed at least in part by the method of claim 1, the system comprising:
a first semiconductor device comprising the first substrate; and
a second semiconductor device comprising the second substrate, wherein each of the interconnects between the first semiconductor device and the second semiconductor device is surrounded by a corresponding portion of the insulative layer.

6. The system of claim 5, wherein:
the first semiconductor device further comprises the first plurality of contacts and the insulative layer,
the second semiconductor device further comprises the second plurality of contacts,
the first semiconductor device is a detector circuit, and
the second semiconductor device is a readout circuit.

7. The method of claim 1, wherein the insulative layer comprises a plurality of cavities defined therein and a plurality of channels defined therein, the method further comprising disposing underfill material in the plurality of channels.

8. The method of claim 1, wherein the insulative layer comprises:
a plurality of cavities defined therein and arranged in an array having a first direction and a second direction perpendicular to the first direction; and
a plurality of channels defined therein and arranged at an angle relative to the first and second directions.

9. A method of interconnecting a first substrate to a second substrate, the method comprising:
forming a first plurality of contacts on the first substrate;
forming an insulative layer on the first substrate, wherein the forming the insulative layer comprises:
depositing an insulative material on the second substrate; and
etching the insulative material to form the insulative layer having a plurality of cavities defined therein and a plurality of channels defined therein, wherein each of the first plurality of contacts is in a corresponding one of the plurality of cavities;
forming a second plurality of contacts on the second substrate; and
joining the first plurality of contacts to the second plurality of contacts to form interconnects between the first substrate and the second substrate, wherein, when the first and second substrates are joined, at least a portion of each of the interconnects is surrounded by the insulative layer.

10. The method of claim 9, wherein each of the plurality of channels extends from and/or between one or more of the plurality of cavities.

11. The method of claim 9, wherein the plurality of cavities are arranged in an array having a first direction and a second direction perpendicular to the first direction, and wherein the plurality of channels are arranged at an angle relative to the first and second directions.

12. The method of claim 9, further comprising disposing underfill material in the plurality of channels.

13. The method of claim 12, wherein the underfill material comprises epoxy, and wherein the disposing comprises wicking the epoxy through the plurality of channels, and wherein the method further comprises disposing the underfill material at least partially in the plurality of cavities.

14. An imaging system comprising:
a first semiconductor device comprising a first substrate, a first plurality of pads, and an insulative layer, wherein the insulative layer comprises a plurality of cavities defined therein and a plurality of channels defined therein;
a second semiconductor device comprising a second substrate and a second plurality of pads; and
a plurality of interconnects connected to the first semiconductor device and the second semiconductor device, wherein each of the plurality of interconnects is surrounded by a corresponding one of the plurality of cavities, wherein each of the plurality of interconnects couples one of the first plurality of pads to one of the second plurality of pads,
wherein:
the first semiconductor device comprises a detector circuit; and
the second semiconductor device comprises a readout circuit.

15. The imaging system of claim 14, wherein the first semiconductor device further comprises a first plurality of contacts, wherein the second semiconductor device further comprises a second plurality of contacts, and wherein each of the first plurality of contacts is in contact with a corresponding one of the second plurality of contacts to form a corresponding one of the plurality of interconnects.

16. The imaging system of claim 14, wherein each of the plurality of channels extends from and/or between one or more of the plurality of cavities.

17. The imaging system of claim 14, wherein the plurality of cavities are arranged in an array having a first direction and a second direction perpendicular to the first direction, and wherein the plurality of channels are arranged along a direction diagonal relative to the first and second directions.

18. The imaging system of claim 14, further comprising an underfill material disposed in the plurality of channels, wherein the underfill material comprises epoxy, and wherein the insulative layer is a dielectric layer or a photoresist layer.

19. The imaging system of claim 14, further comprising an underfill material disposed in the plurality of channels and at least partially in the plurality of cavities.

20. The imaging system of claim 14, wherein the insulative layer is disposed on the first substrate, and wherein no insulative layer is disposed on the second substrate such that a surface of the insulative layer disposed on the first substrate faces a surface of the second substrate.

* * * * *